(12) United States Patent
Christenson et al.

(10) Patent No.: US 7,645,627 B2
(45) Date of Patent: Jan. 12, 2010

(54) METHOD FOR MANUFACTURING A SENSOR DEVICE

(75) Inventors: John C. Christenson, Kokomo, IN (US); Dan W. Chilcott, Greentown, IN (US); Richard G. Forestal, Carmel, IN (US); Jack L. Glenn, Kokomo, IN (US); Seyed R. Zarabadi, Kokomo, IN (US)

(73) Assignee: Delphi Technologies, Inc., Troy, MI (US)

( * ) Notice: Subject to any disclaimer, the term of this patent is extended or adjusted under 35 U.S.C. 154(b) by 7 days.

(21) Appl. No.: 12/011,063

(22) Filed: Jan. 24, 2008

(65) Prior Publication Data

US 2009/0191660 A1 Jul. 30, 2009

(51) Int. Cl.
*H01L 21/00* (2006.01)
(52) U.S. Cl. .................................. 438/53; 257/E21.001
(58) Field of Classification Search ................... 438/50, 438/53; 257/415, 417–419, E21.001
See application file for complete search history.

(56) References Cited

U.S. PATENT DOCUMENTS

| 5,153,143 | A | 10/1992 | Schlais et al. |
|---|---|---|---|
| 5,366,916 | A | 11/1994 | Summe et al. |
| 5,450,751 | A | 9/1995 | Putty et al. |
| 5,547,093 | A | 8/1996 | Sparks |
| 5,872,034 | A | 2/1999 | Schlais et al. |
| 5,872,313 | A | 2/1999 | Zarabadi et al. |
| 6,121,552 | A * | 9/2000 | Brosnihan et al. ........... 174/253 |
| 7,214,625 | B2 | 5/2007 | Asami et al. |
| 2006/0234413 | A1* | 10/2006 | Chilcott ....................... 438/50 |

OTHER PUBLICATIONS

"Crystal Planes in Semiconductors," Brigham Young University, Department of Electrical & Computer Engineering, 3 pages, © 1994-2004.

* cited by examiner

*Primary Examiner*—W. David Coleman
*Assistant Examiner*—Daniel Shook
(74) *Attorney, Agent, or Firm*—Jimmy L. Funke

(57) ABSTRACT

A motion sensor in the form of an angular rate sensor and a method of making a sensor are provided and includes a support substrate and a silicon sensing ring supported by the substrate and having a flexive resonance. Drive electrodes apply electrostatic force on the ring to cause the ring to resonate. Sensing electrodes sense a change in capacitance indicative of vibration modes of resonance of the ring so as to sense motion. A plurality of silicon support rings connect the substrate to the ring. The support rings are located at an angle to substantially match a modulus of elasticity of the silicon, such as about 22.5 degrees and 67.5 degrees, with respect to the crystalline orientation of the silicon.

12 Claims, 16 Drawing Sheets

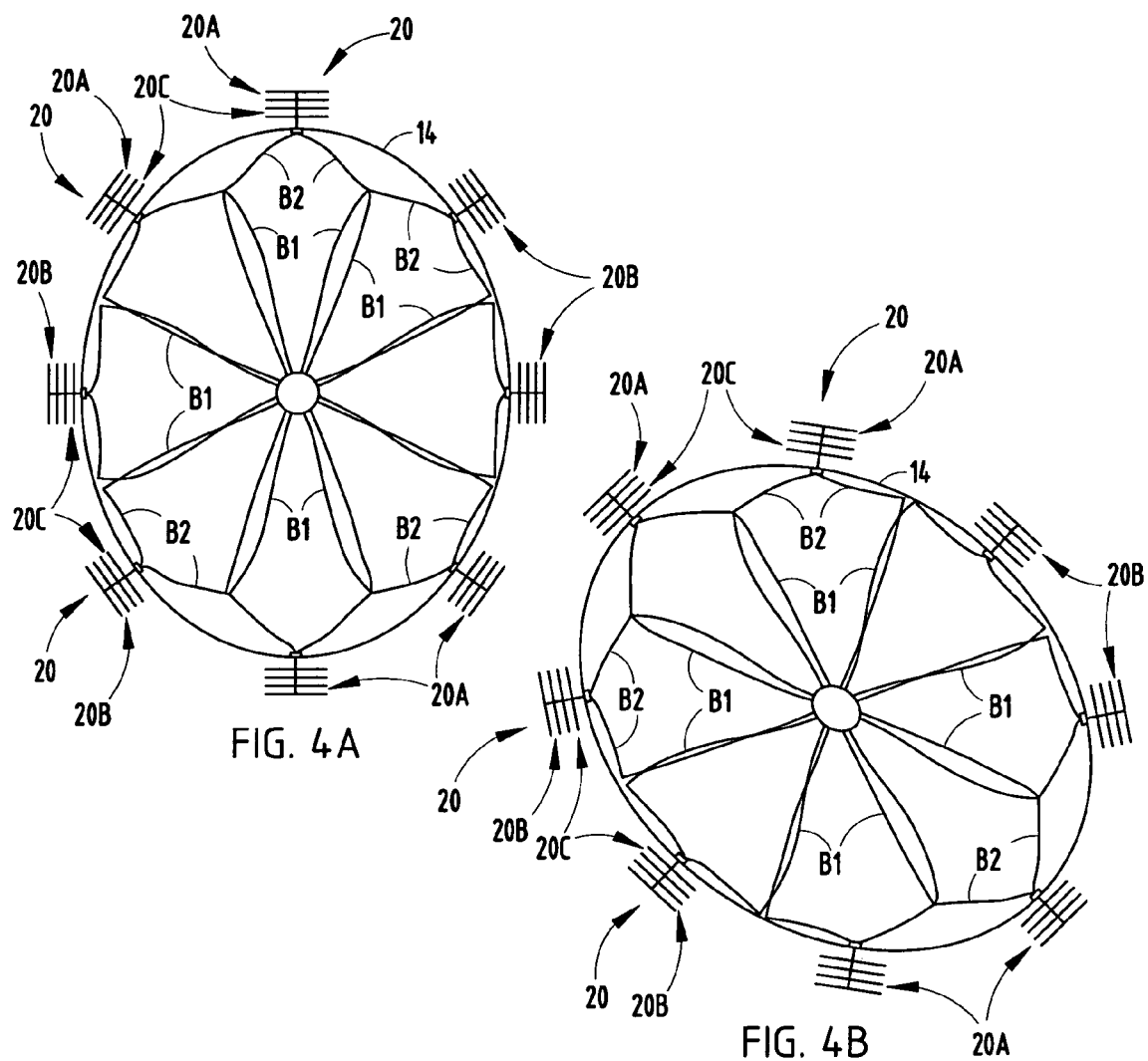
FIG. 4A
FIG. 4B
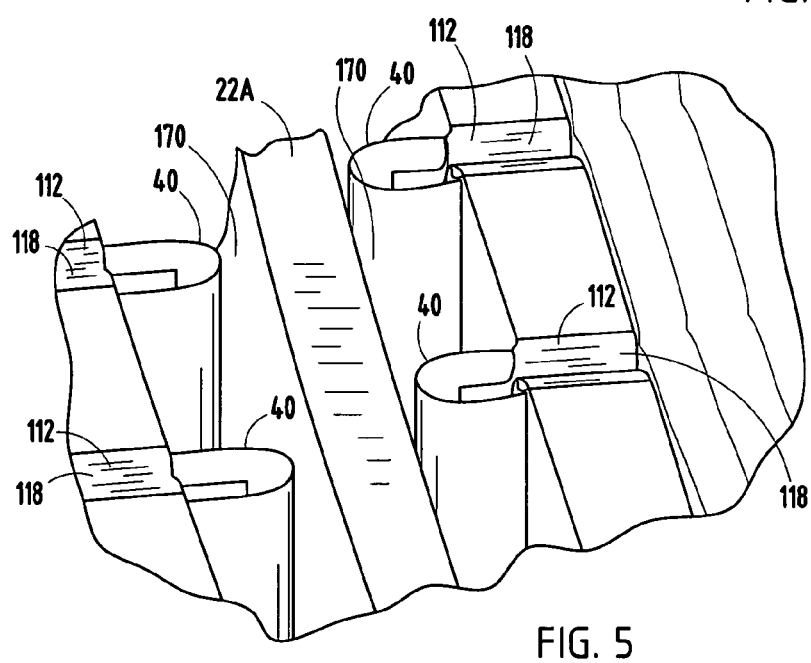
FIG. 5

METHOD FOR MANUFACTURING A SENSOR DEVICE

TECHNICAL FIELD

The present invention generally relates to sensors, and more particularly relates to a silicon motion sensor, such as an angular rate sensor, and a method of manufacturing a sensor.

BACKGROUND OF THE INVENTION

Motion sensors, such as angular rate sensors, are commonly employed in various applications to sense motion, such as angular rate. Sensors such as these are commonly manufactured as microelectromechanical system (MEMS) devices using conventional micromachining techniques. Typically, a MEMS sensor may employ an electrically conductive micromachined plate of metal or silicon as a sensing element. Examples of such devices are disclosed in U.S. Pat. Nos. 5,450,751; 5,547,093 and 5,872,313.

Sensors of the type described above are capable of extremely precise measurements. However, conventional sensors may suffer various drawbacks which may include mismatches in the resonant frequency between primary and secondary flexure nodes at the sensor element, and may suffer from relatively high mass and performance limitations. Another drawback of some conventional sensors is undesirable sensitivity to vibration. Therefore, it would be desirable to provide for a motion sensor and method of manufacturing a sensor that overcomes drawbacks of the prior art.

SUMMARY OF THE INVENTION

In accordance with one aspect of the present invention, a motion sensor is provided. The motion sensor includes a support substrate and a silicon sensing ring formed within and supported by the substrate and having a flexural resonance. The motion sensor also includes at least one drive electrode including drive capacitive plates for applying electrostatic force on the ring to cause the ring to resonate, and at least one sense electrode including sense capacitor plates for sensing a change in capacitance indicative of the vibration nodes of resonance of the ring so as to sense motion. The motion sensor further includes a plurality of silicon support springs connecting the substrate to the ring, wherein the support springs are located at an angle to substantially match a modulus of elasticity of the silicon support springs. According to a further aspect of the present invention, the support springs include a first spring located at an angle in the range of 20° to 25° with respect to the crystalline orientation of the silicon, and a second spring oriented at an angle in the range of 65° to 70° with respect to the crystalline orientation of the silicon.

According to another aspect of the present invention, a method of making a silicon integrated sensor on an SOI substrate is provided. The method includes the step of providing a substrate having an insulation layer on a top surface, and providing a silicon epitaxial layer on top of the insulation layer. The method also includes the steps of forming a first trench extending through the epitaxial layer and reaching the insulation layer so as to isolate a first portion of the epitaxial layer from a second portion of the epitaxial layer, and disposing a fill material within the first trench. The method also includes the steps of forming one or more electrical components on the first portion of the epitaxial layer, and forming one or more contacts on the second portion of the epitaxial layer. The method further includes the step of forming one or more second trenches in the second portion of the epitaxial layer so as to provide one or more moving elements within the second portion of the epitaxial layer, wherein the one or more movable elements serve as sensing elements. According to a further embodiment, the method includes the step of forming one or more anti-stiction bumps to prevent a portion of a moving element from sticking to an adjacent feature of the sensor.

These and other features, advantages and objects of the present invention will be further understood and appreciated by those skilled in the art by reference to the following specification, claims and appended drawings.

BRIEF DESCRIPTION OF THE DRAWINGS

The present invention will now be described, by way of example, with reference to the accompanying drawings, in which:

FIGS. 4A and 4B are schematic diagrams illustrating a two-node flexural motion of the ring angular rate sensor in respective primary mode vibration and secondary mode vibration;

FIG. 5 is an enlarged perspective view of section V taken from FIG. 3 further illustrating isolation protrusions that form anti-stiction bumps, according to one embodiment;

DESCRIPTION OF THE PREFERRED EMBODIMENTS

Figure 1:
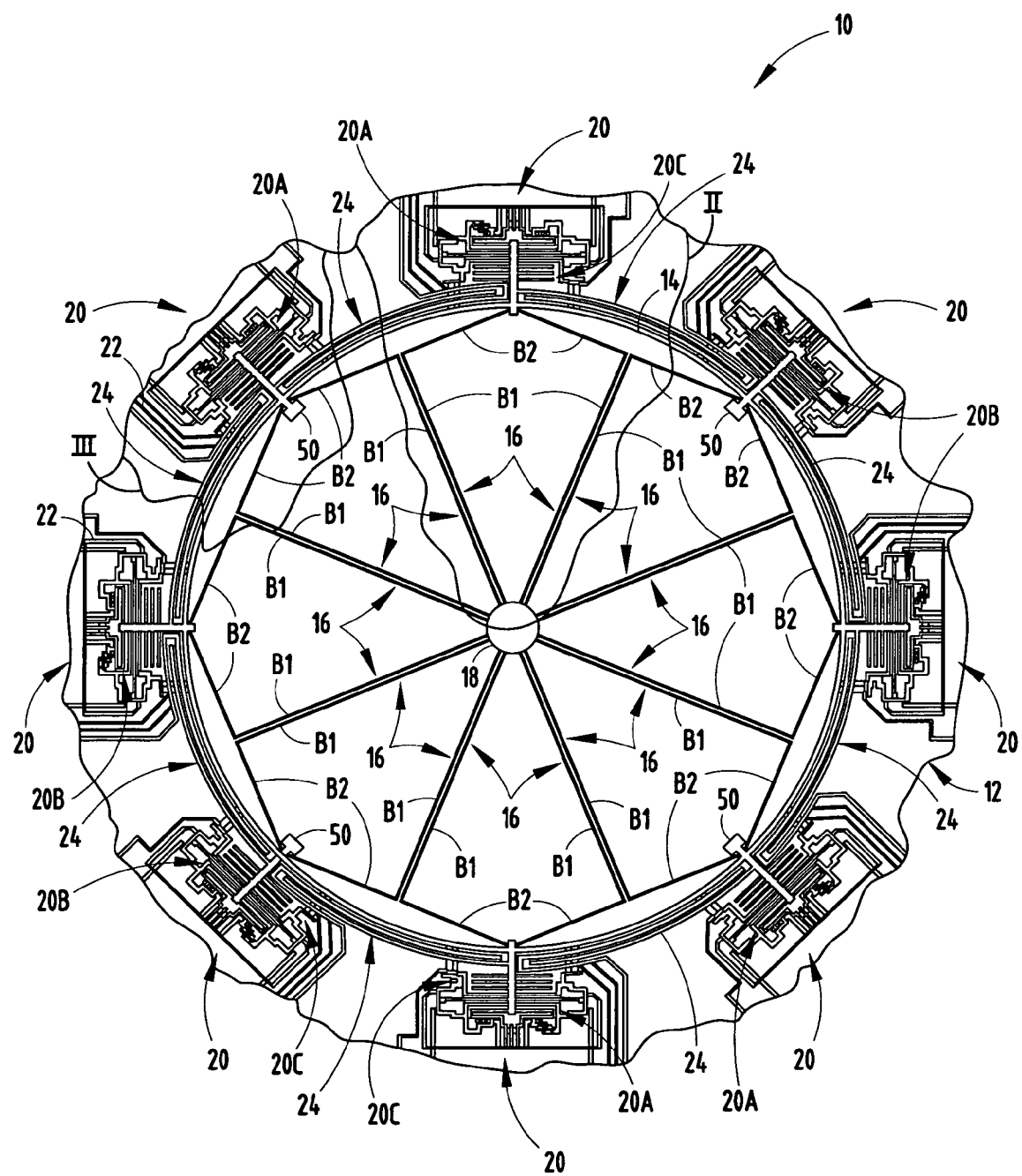
FIG. 1 is a top view of a micromachined angular rate motion sensor according to one embodiment of the present invention.
Figure 2:
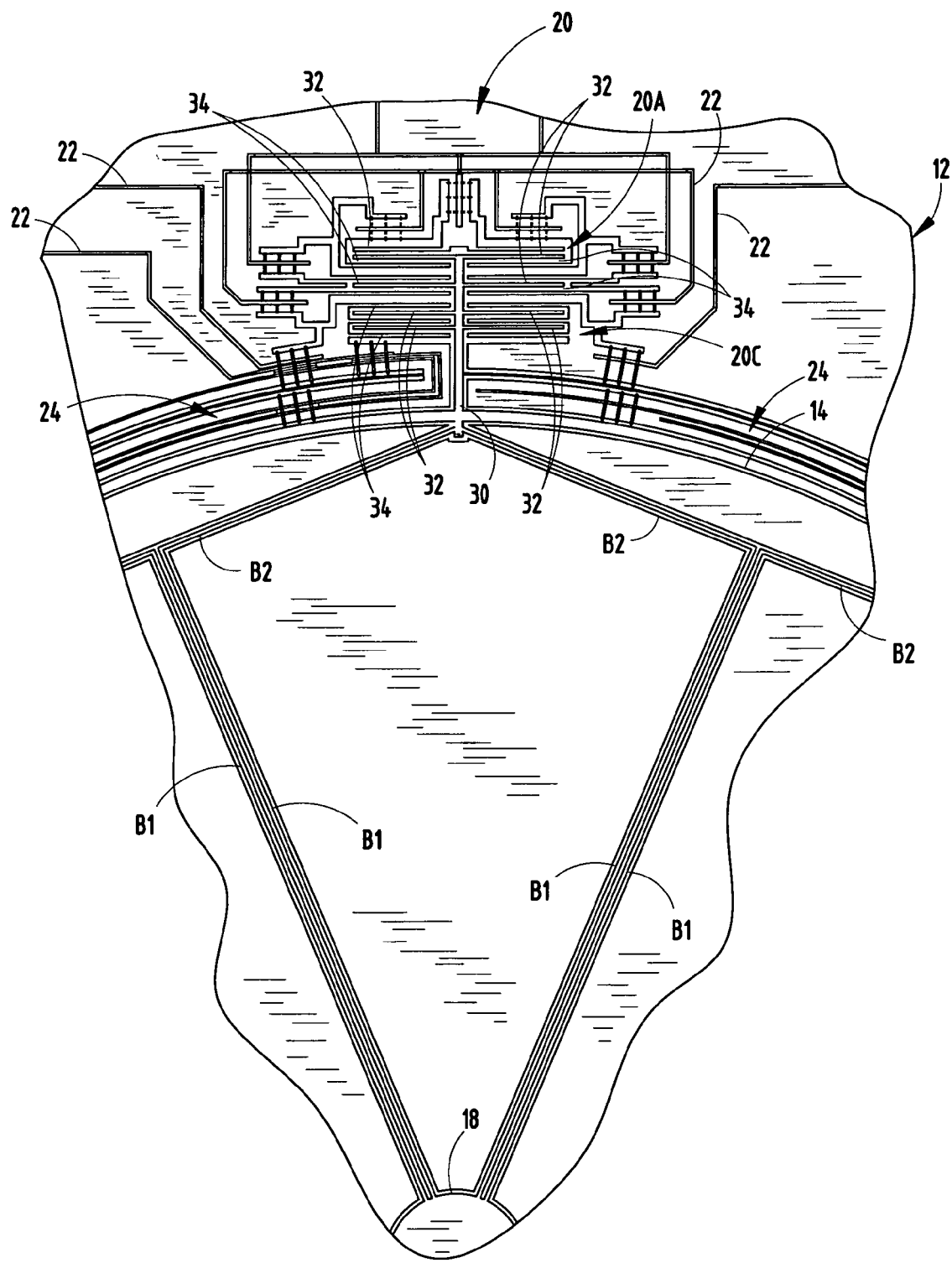
FIG. 2 is an enlarged view of section II-II of FIG. 1 illustrating the springs connecting the ring to the substrate, according to one embodiment.
Figure 3:
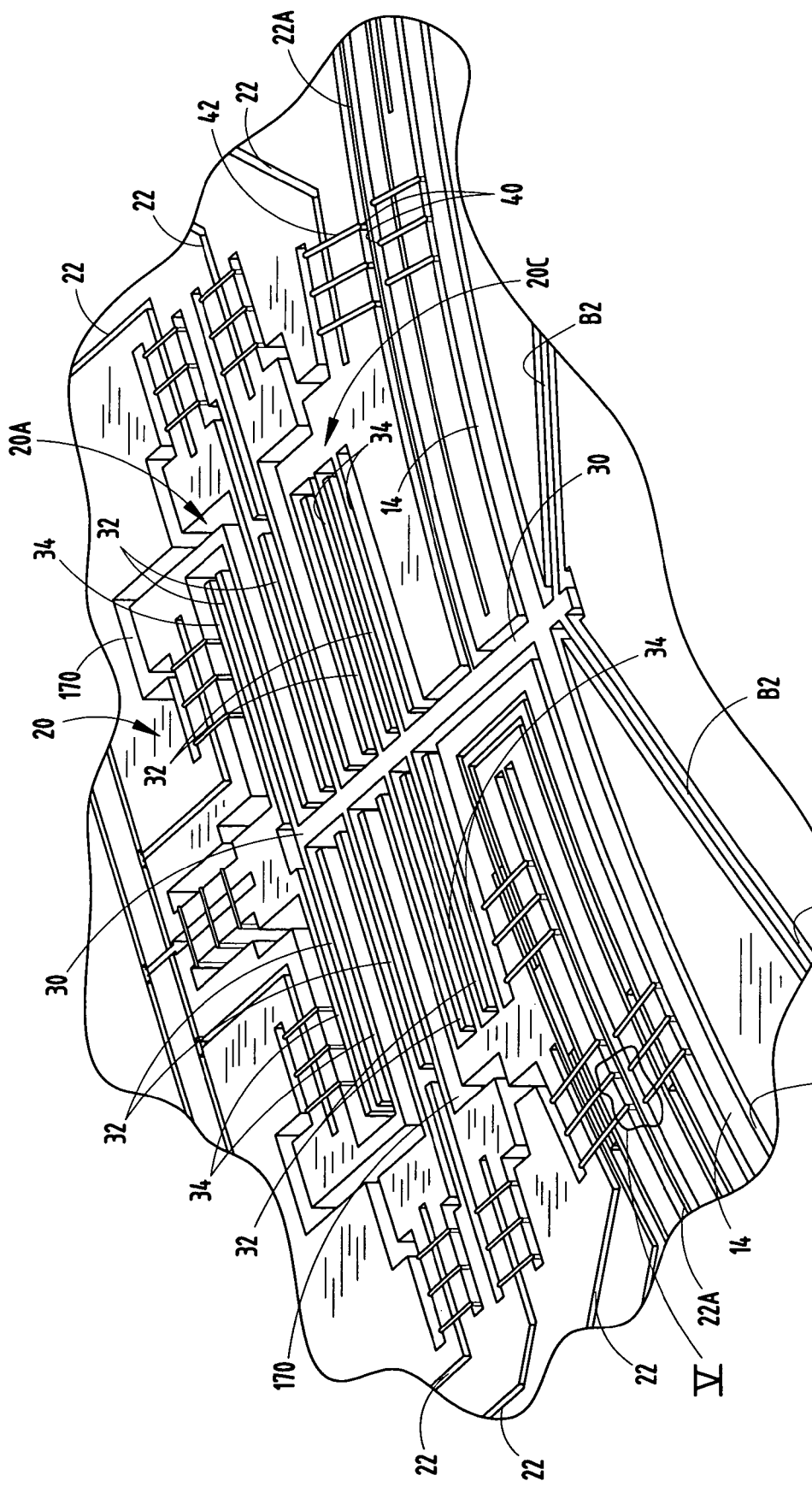
FIG. 3 is an enlarged perspective view of section III-III of FIG. 1 further illustrating the electrode structure.

Referring to FIGS. 1-3, a motion sensor 10 is generally illustrated according to a first embodiment of the present invention. The motion sensor 10 shown and described herein in the disclosed embodiment is an angular rate motion sensor for sensing angular rate. However, it should be appreciated by those skilled in the art that the sensor 10 could also be configured to operate to sense other motions, such as angular acceleration, and may further be configured to sense angular position according to other embodiments.

As seen in FIG. 1, the sensor 10 includes a sensing element formed on a supporting wafer or substrate 12 generally shown in FIG. 1 and more specifically shown in FIGS. 8-34. The substrate 12 is made of silicon, according to one embodiment, and has a bottom layer 100 and has an insulation layer 102 and epitaxial layer 104 formed on top as shown in FIG. 34. The sensing element includes a ring 14 that is generally supported by a plurality of springs 16 each having first and second spring members (portions) that extend from a center hub or post 18 to support the ring 14 relative to the supporting substrate 12. In the disclosed embodiment, the ring 14 is circular, however, other shaped rings may be employed according to other embodiments. The ring 14, springs 16 and central post 18 may also be made of silicon to form an all-silicon monolithic structure. One example of an all-silicon monolithic structure is disclosed in U.S. Pat. No. 5,547,093, which is hereby incorporated herein by reference.

The ring 14 is shown surrounded by a number of electrode structures 20 formed on the substrate 12 and spaced at 45° intervals. The electrode structures 20 form an equiangularly spaced electrode pattern in close proximity to the perimeter of the ring 14. The ring 14 and the electrodes 20 are formed of an electrically conductive material, particularly silicon, enabling the ring 14 to form a capacitor with complimentary features, referred to as capacitive plates, when a voltage potential is present. Some of the electrode structures 20 are configured as drive electrodes 20A that drive the ring 14 into resonance when energized, while other electrode structures 20 are configured as sensing electrodes 20B to capacitively sense the proximity of the vibration pattern of the ring 14, which will vary due to Coriolis forces that occur when the sensor 10 is subjected to rotary motion about an axis perpendicular to the substrate 12.

Each of the electrode structures 20 are also configured to include balance electrodes 20C which, when energized, match the resonant peaks of the natural flexural modes of the ring 14 by inducing electrical spring softening in the ring 14 and in the springs 16, making the device responsive to Coriolis forces that occur when the sensor 10 is subjected to rotary motion about an axis perpendicular to the substrate 12. The balance electrodes 20C are formed by at least one pair of moving capacitive plates interdigitated with fixed plates and shown being radially inward from the drive and sensing electrodes 20A and 20B, and are electrically interconnected to electrical conductors 22. Additional balance electrodes 24 are shown disposed equiangularly around the perimeter of the ring 14, which serve to fine balance the sensing structure. The balance electrodes 24 are offset by 22.5° relative to electrode structures 20 and capacitively coupled to the ring 14 and electrically interconnected with some of the concentric conductors 22. The ring 14, springs 16 and central post 18 are electrically insulated from the wafer 12, and electrically interconnected to electrical conductors 22 outside the ring 14 so as to allow an appropriate electrical potential to be established between the moving structure and the electrodes 20A, 20B, 20C and 24.

The motion sensor 10 is configured to detect angular velocity about the vertical axis of the ring 14, and therefore rotary movement about an axis of a body, such as an automobile, to which the sensor 10 is mounted. In one embodiment, conditioning circuitry (not shown) is formed on and electrically interconnects with the sensing electrodes 20B, and differential driving and sensing techniques may be employed. One example of a motion sensor having suitable conditioning circuitry and employing differential driving and sensing techniques is disclosed in U.S. Pat. No. 5,872,313, the entire disclosure of which is hereby incorporated herein by reference. The operational requirements of conditioning circuitry and the driving and sensing techniques should be appreciated by those skilled in the art, and therefore are not discussed herein in detail.

Performance of the sensor 10 may be optimized by equiangularly positioning the electrode structures 20 around the perimeter of the ring 14. It should be appreciated that at least one drive electrode is required, and that more preferably at least two drive electrodes 20A are employed, with the two drive electrodes 20A offset from each other by about 45°, according to one embodiment. However, other electrode configurations are foreseeable. It should also be appreciated that at least one sensing electrode 20B is employed, and that more preferably a plurality of sensing electrodes 20B are employed. Further, the performance of the sensor 10 may be enhanced by increasing the number of sensing electrodes 20B present. According to one embodiment, it should be further appreciated that at least one balance electrode 20C is employed, and that more preferable a plurality of balancing electrodes 20C are employed.

The electrode structures 20 are shown in FIG. 3 generally employing a base plate or trunk 30 that extends radially from the ring 14, and multiple pairs of opposing teeth or plates 32 extending perpendicularly from the trunk 30. Because the trunk 30 and the plates 32 are physically connected to the ring 14 and formed integrally with the ring 14, the trunk 30 and plates 32 are subjected to the same vibratory movement as the ring 14. A stop may be employed for limiting the lateral movement from the trunk 30, and therefore prevents the plates 32 from contacting the surrounding electrode structure due to excessive angular and/or linear acceleration of the ring 14. The trunk 30 and plates 32 may be subjected to thermal expansion and contraction with the ring 14 when subjected to variations in temperatures, which may be compensated for according to known techniques, such as is disclosed in U.S. Pat. No. 5,872,313. It should be appreciated that temperature compensation is generally not needed with the disclosed embodiment of the sensor 10 due to the all silicon construction.

Each electrode structure 20 further includes an arrangement of fixed electrodes 34 that are interdigitized with the movable plates 32. The fixed capacitive plates 34 are fixed to the support substrate 12. Four of the electrode structures 20 employ the outermost pairs of movable capacitive plates to form drive electrodes and the pair of radially inward movable capacitive plates 32 form balance electrodes, whereas the other four electrode structures 20 employ the outermost pair of movable capacitive plates 32 to form sensing electrodes and employ the innermost pair of movable capacitive plates 32 to form balance electrodes 20C. The movable capacitive plates 32 are movable relative to the fixed capacitive plates 34 such that the distance therebetween changes the capacitive coupling. Changes in capacitive coupling between the movable sensing plates and fixed plates are detected and indicative of the sensed angular rate. With the application of Coriolis force, radial flexural motion at nodes indicates angular rate sensed by the sensor 10, while flexural motion at anti-nodes indicates motion of the ring.

The design of the ring angular rate sensor 10 in silicon as a mechanical structure poses challenges when the crystal plane orientation is <100> or <110>. Integrated microsensors incorporate microsensing structure(s) along with its associated drive, sense, control and calibration electronic circuits on the same piece of silicon substrate to realize a high performance system on chip at competitive cost. Due to the significant differences in the electrical performance of CMOS transistors realized in a <111> plane or other planes compared to the performance of CMOS transistors realized in <100> or <110> planes, almost all CMOS integrated circuits (ICs) utilize silicon substrate orientations of <100> or <110>.

It is known that certain mechanical properties of single crystal silicon are also orientation dependent and also vary with dopant type and dopant concentration. It turns out that the modulus of elasticity of single crystal silicon is also orientation dependent. The longitudinal modulus of elasticity $C'_{11}(\theta)$, in a direction forming an angle $\theta$ with <100> silicon, can be calculated by using the following equation:

$$C'_{11}(\theta)=C_{11}(\cos^4\theta+\sin^4\theta)+2(C_{12}+C_{44})\cos^2\theta\sin^2\theta$$

where $C_{11}$ is the longitudinal modulus of elasticity along the <100> direction, and $C_{12}$ and $C_{44}$ are the corresponding transverse moduli of elasticity. For intrinsic silicon, $C_{11}=1.66$, $C_{12}=0.639$, and $C_{44}=0.796$. It should be noted that $C'_{11}(\theta)$ has a larger value at 45°, 135°, 225° and 315° angles than at right angle locations of 0°, 90°, 180° and 270°.

Figure 2A:
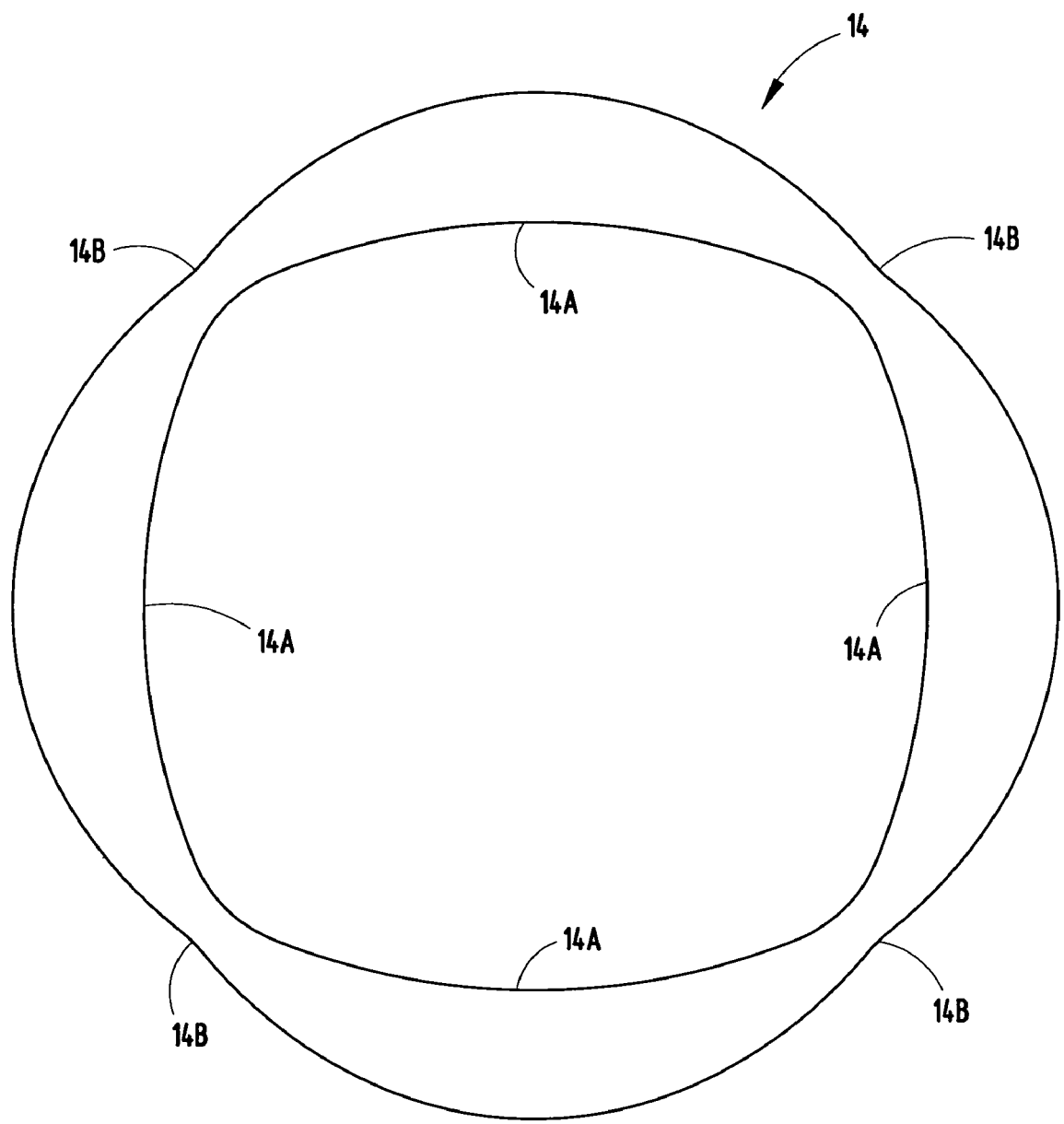
FIG. 2A is a schematic diagram illustrating a ring having a varying width according to another embodiment.

According to one embodiment shown in FIGS. 1 and 3, the ring 14 is configured with a substantially uniform width. According to another embodiment, the ring 14 may be configured with a varying width, such as shown in FIG. 2A. In this embodiment, the width of the ring 14 varies according to a sinusoidal waveform to provide maximum ring widths 14A at 0°, 90°, 180°, and 270°, and to provide minimum ring widths 14B at 45°, 135°, 225°, and 315°. By varying the width based on a sinusoidal waveform, the mass compensator ring 14 accounts for varying modulus of elasticity around the ring 14.

The ring angular rate sensor 10 operates on the principle of Coriolis force. The sensor 10 measures angular velocity by monitoring the position of nodes in its two-node flexural vibration pattern. There are two degenerate frequencies of equal values associated with the two-node flexural mode. When the ring is electrostatically driven into an elliptical-shape vibration, at least one location (primary) on the ring, the motion at this primary location is radial by nature. However, the radial motion at the 45° (secondary) locations from the primary location is ideally zero and only tangential motions exist at these locations. Upon the application of angular rate input, the vibration pattern which has four nodes and four anti-nodes at eight locations on the ring 14 tends to precess, resulting in energy coupling from the primary locations to the secondary locations, resulting in radial motion at the secondary locations. The coupling efficiency strongly depends on matching the frequencies of the two-node flexural degenerate frequencies. Assuming matched primary and secondary mode frequencies, the amplitude of the radial motion at secondary locations due to node precession because of the applied Coriolis force is proportional to the amplitude of the angular rate input. Any difference in the frequency of the degenerate modes will reduce the energy coupling from the primary mode to the secondary mode, and thus reduce the sensitivity of the device to angular rate input.

The angular rate sensor 10 operates based on mode matching of its two flexural modes and symmetric damping. The mode numbers of the angular rate sensor 10 are a function of ring material properties, ring dimension and the design and dimension of the supporting springs 16. The two-node flexural modes have been discovered through ANSYS simulations to be the fourth and fifth modes of the rate sensor 10, according to one embodiment. The fourth and fifth two-node flexural mode matching is employed to sense angular velocity, based on vibration coupling through the Coriolis force. In the absence of angular rate inputs, the ring vibrates and causes forced oscillation on the 0° and 90° locations. The oscillation may be achieved using a known phase locked loop (PLL) circuit using the ring 14 as a reference frequency input and a voltage controlled oscillator (VCO) whose frequency is locked to the ring frequency. In this situation, generally all the amplitude of ring vibration is in the first normal mode (0° and 90° locations), which is referred to as the primary mode, and there is no radial motion in the second mode (±45° locations) which is referred to as the secondary mode. Upon experiencing rotation, the Coriolis force will cause energy to be transferred from the primary mode to the secondary mode, building up vibration amplitude in the secondary mode. The ratio of the amplitude of the secondary mode vibration to the amplitude of the primary mode vibration may be representative of the following equation:

Secondary/primary=$2 \times \alpha \times Q \times \Omega / \omega$, where $\alpha$ is the ring angular gain, $Q$ is the quality factor, $\omega$ is the two-node flexural natural frequency, and the $\Omega$ is the angular velocity experienced by the sensor 10.

An exaggerated version of the two-node flexural motion of the ring angular rate sensor 10 is illustrated in FIG. 4A in the primary mode vibration and is shown in FIG. 4B in the secondary mode vibration. It has been discovered that the use of curved or semi-circular springs in prior art devices may result in a gross frequency mismatch between the primary and secondary two-node flexural normal modes, rendering the conventional device generally insensitive to angular velocity input. This is at least partly due to the fact that the modulus of elasticity of single crystal silicon is orientation dependent. The motion sensor 10 according to the present invention advantageously employs a spring design that provides insensitivity to the silicon crystal orientation modulus of elasticity variation. Specifically, in one embodiment the motion sensor 10 employs sixteen springs 16 (eight pairs) that are attached to the ring 14 at 45° increment angular locations at one end and to the fixed anchor center post 18 at the other end.

The springs 16 are illustrated in the layout of the sensor 10 in FIGS. 1 and 2. As discussed with regard to the above equation, the modulus of elasticity of silicon is equal along 0°, 90°, 180° and 270° directions. The modulus of elasticity of <100> and <110> silicon is also equal along ±22.5° and ±67.5° with respect to 0° and 90° directions in <100> and <110> silicon. With particular reference to FIG. 2, each of the eight pairs of springs 16 is constructed with two straight beams, namely B1 and B2. It should also be noted that beams B1 and B2 are oriented at ±22.5° with respect to X- and Y-axes, respectively. This strategic beam positioning assures that all segments contributing to the construction of each of the eight pairs of springs 16 have constant modulus of elasticity, which simply ensures a matched spring constant for all springs 16.

The second cause of mismatch between the two-node flexural mode frequencies is the varying modulus of elasticity around the ring 14. The variation of the modulus of elasticity around the ring 14 follows the aforementioned equation, which implies that the modulus of elasticity is matched at locations of 0°, 90°, 180° and 270°. The modulus of elasticity is also matched at locations of 45°, 135°, 225° and 315°. However, it should be noted that the modulus of elasticity exhibits a minimum value at 0°, 90°, 180° and 270° locations and maximum value at 45°, 135°, 225° and 315° locations. The primary and secondary frequencies matching of the two-node flexural mode is determined by the matching of the spring constant amongst the springs 16 and the matching of the spring constant at 0° and 45° locations on the ring 14. In order to compensate for the spring constant variation around the ring 14, the width of the ring 14 may be varied according to the above equation as shown in FIG. 2A or by employing lumped compensating masses 50 at the inward end of trunk 30 at each of the 45°, 135°, 225° and 315° locations, as shown in FIGS. 1 and 3. Due to the designed-in structure symmetries and matching of the modulus of elasticity within the ring 14 and the springs 16, symmetric damping is assured. Symmetric damping assures minimum sensor error due to drive amplitudes or temperature. This is advantageous for proper device performance in practical settings.

While the sensor 10 is described particularly as an angular rate motion sensor, those skilled in the art will appreciate that the sensor 10 could also operate as an acceleration sensor, or as a position sensor. Further, four, six and eight node operation of the sensor 10 is possible. The separation of the resonant peaks between the four, six and eight node resonant frequencies in the disclosed embodiment is very wide for the sensor 10; by nearly a factor of two. This allows for easy discrimination between the resonant frequencies.

The sensor components, both movable and fixed, including the ring 14, springs 16, highly compliant external tethers 22, compensating masses 50, interdigitated members including capacitor plates 32 and 34, support structures and anchors may be formed from a silicon-on-insulator (SOI) substrate along with on-board electronic compensating circuitry. According to one embodiment, the sensor components are all made of single crystal silicon, and therefore generally have no thermal mismatch that would need compensation. Further, the sensor components are fabricated in the plane of the substrate, which makes them less prone to damage than components of conventional devices. The sensor components are also formed and released during the same photolithographic and etch steps, thereby decreasing the process complexity, and lowering the costs of manufacture.

The electrical contact to the ring 14 is made with highly compliant external tethers 22 that form electrical connections. The tethers 22 eliminate the need for contact to the center hub 18 of the sensor 10, and the known problems associated with a center hub contact, such as wire bonding damage, stray capacitances, and variable capacitances from wire bonds moving relative to each other. All of the sensor components are anchored to, but cantilevered from, an insulator film (oxide 102) on top of an underlying substrate 100 as shown in FIG. 34, which is achieved through center hub 18, and/or through the highly compliant external tethers 22. All sensor components are otherwise free to move, according to one embodiment. This arrangement with trench isolation provides for electrically and mechanically isolated components.

In one embodiment, a trench isolation scheme is utilized to form one or more trenches 112 to isolate portions of the epi layer 104 shown in FIG. 34, as well as the sensor components. Isolation trenches 112 may be provided as shown in FIG. 5 and may be lined with an insulator film, such as an oxide, filled with an appropriate material such as polysilicon 118, and then capped so that conductors can carry electrical signals across the isolation areas. Later, other trenches 170, such as those surrounding a delineated sensor component like the ring 14 or a compliant tether 22 are formed. The ends 40 of the filled isolation trenches 112 protrude into the trenches 170 isolating the moving element 22A as shown in FIG. 5. The ends 40 of the filled isolation trenches 112 then act as anti-stiction bumps, thus preventing the lateral stiction of the movable sensor components, such as the ring 14 and the highly compliant external tethers 22, and other sensor components, to the walls of the epi layer, and the fixed sensor components surrounding them.

Figure 6:
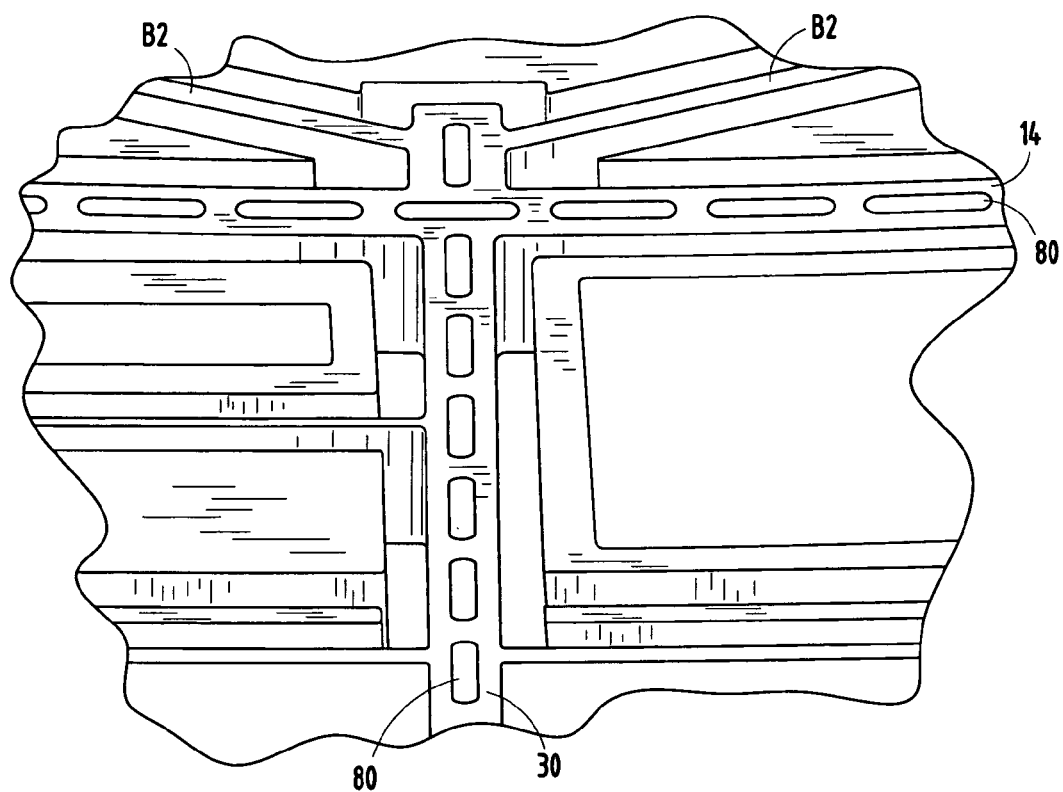
FIG. 6 is an enlarged perspective sectional view of the motion sensor further illustrating a perforated structure according to another embodiment.
Figure 7:
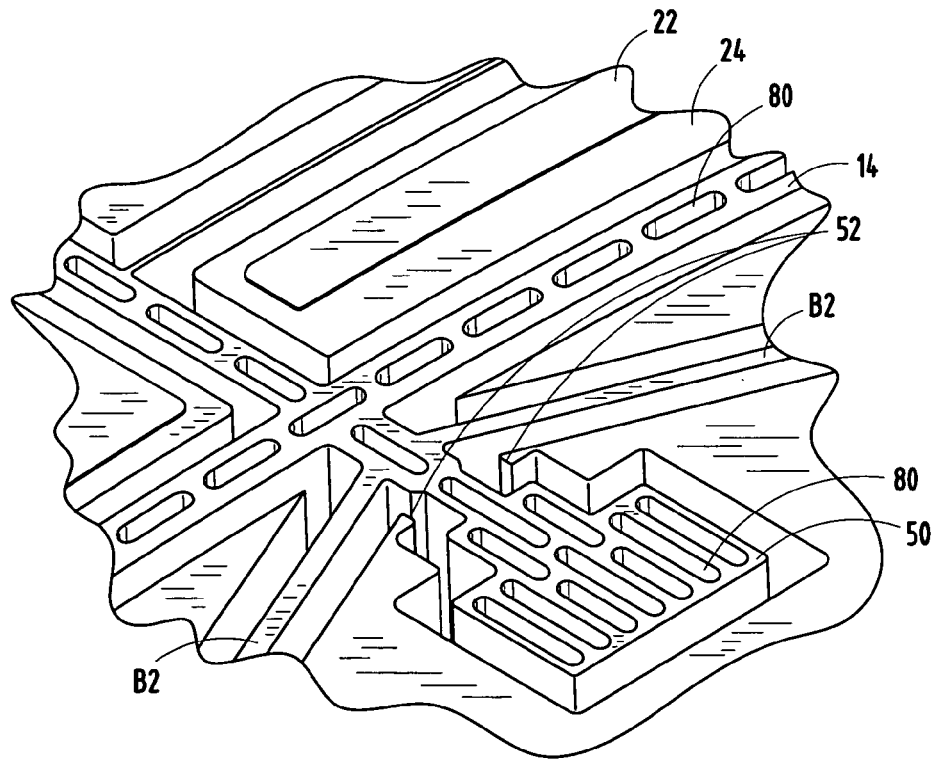
FIG. 7 is an enlarged perspective sectional view of the motion sensor further illustrating a perforated compensation mass and corner compensations, according to a further embodiment.

In addition, the components of the sensor 10, both movable and fixed, may be perforated to provide openings that allow for relatively low mass, yet still retaining appropriate rigidity, and to aid in the manufacture of the sensor 10. In some designs, a lower mass for certain sensor components is desirable. Further, to aid in the manufacture of several of the sensor components, perforations may be desirable. Sensor components such as the ring 14, trunk 30 and compensating masses 50 may all be perforated as shown in FIGS. 6 and 7. In addition, other sensor components, such as tethers 22 and 22A and capacitive plates 32 may include perforations 80.

In one embodiment of the motion sensor 10, corners of several sensor components may be compensated to include portions of the epi layer 104, as shown by reference identifier 52 in FIG. 7. The corner compensation 52 allows for process variation during the delineation and release processes.

In one embodiment, the movable capacitive drive and sense electrodes are connected to trunk 30 whose attachment to the ring 14 is cantilevered from the ring 14. The cantilevered connection has two attachment points to the ring 14 for stability, and to allow a perforation 80 between the ring 14 and the trunk 30. The perforation 80 may further aid the manufacture of the sensor. Differential drive and differential sense further improve the sensor vibration rejection and the temperature response.

It should be appreciated that the angular rate sensor 10, according to the present invention may advantageously be employed on a vehicle, such as a wheeled automobile. For example, the angular rate sensor 10 may be employed in an electronics stability control system to prevent accidents caused by unwanted angular rotations of a moving vehicle. In doing so, the angular rate sensor 10 is used to detect the unwanted angular rotations.

Method of Manufacturing Sensor

A method of making an all-silicon integrated sensor 10 on silicon-on-insulator (SOI) substrate, will now be described. The method is discussed in connection with making an all-silicon angular rate sensor, such as sensor 10 described herein. However, it should be appreciated that the method may be employed to manufacture other silicon sensor devices. These devices may be made simultaneously on the same substrate and in any combination.

According to one embodiment, the method employs a CMOS process, modified to include an isolation and anti-stiction bump module, a defect getter module, and a sensor delineation etch and release module. The CMOS circuitry provides on-board signal processing for the fabricated sensor 10. The isolation process module provides isolation between regions of the device silicon layer, between the sensor element and the compensating electronics, and between components of the sensor element. Additionally, the isolation process module provides anti-stiction bumps such that the ring and other moveable portions of the sensor element, such as the external tethers, do not stick to portions of the surrounding sensor. The method of making the sensor is flexible, such that sensors made with the process may sense different physical quantities, such as angular rate, angular acceleration, and linear acceleration in one or more than one direction. These devices may be made simultaneously, alone or in any advantageous combination.

Figure 8:
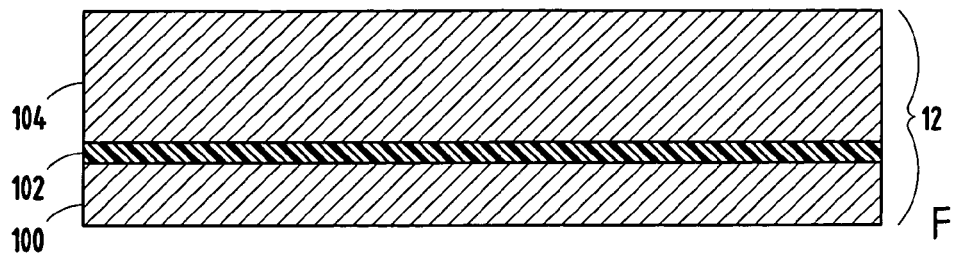
FIG. 8 is a cross-sectional view of a sensor device being manufactured following the initial steps, according to one embodiment of the present invention.

The method will now be described in connection with the series of processing steps, which in one embodiment are shown in the drawing FIGS. 8-34. It should be appreciated that some common processing steps are not shown or described in detail herein. The process method according to one embodiment of the present invention begins with a starting material having a silicon substrate 100 on the bottom with an oxide insulation layer 102 provided on top, and an epitaxial (epi) device layer 104 of silicon formed upon the layer of oxide 102. According to one example, the device layer 104 has a thickness of approximately 40 micrometers, and the layer of oxide 102 has a thickness in the range of 100 angstroms to 2 micrometers. The starting material including the underlying substrate 100, the oxide insulation layer 102, and the epitaxial (epi) device layer 104 are illustrated in FIG. 8 according to one embodiment.

Figure 9:
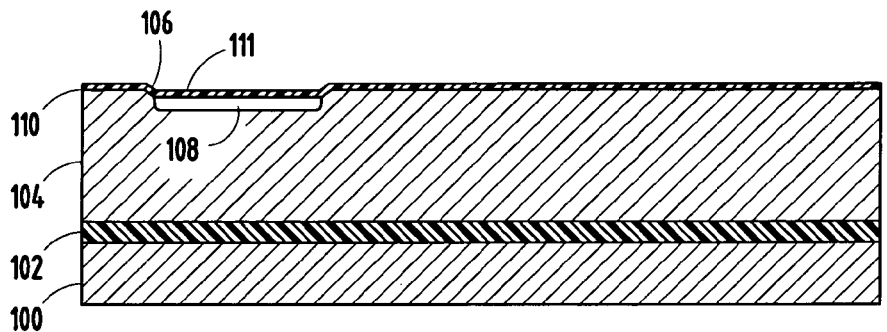
FIG. 9 is a cross-sectional view of the sensor device illustrating another step of the method.

In the step shown in FIG. 9, an oxide layer 110 is provided on top of the silicon device layer 104, and mask and etching steps open portions of the oxide layer 110. A second thinner layer of oxide 111 is then formed in the window in the first oxide 110 on the silicon device layer 104, creating recess 106. An n-type dopant 108, such as phosphorus, is then implanted through the second oxide film 111, but not through the first oxide film 110, into the silicon (N-well implant) device layer 104, and the silicon is then annealed and the dopant activated, such as by heating. The surface of the silicon device layer 104 is then stripped of oxide layers 110 and 111.

Figure 10:
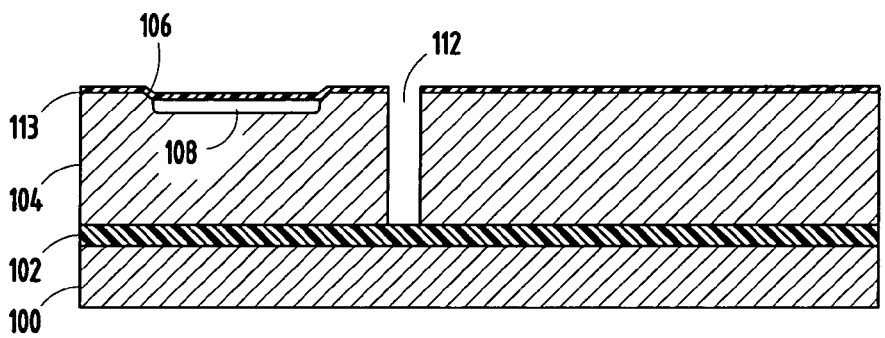
FIG. 10 is a cross-sectional view of the device illustrating another step of the method.
Figure 11:
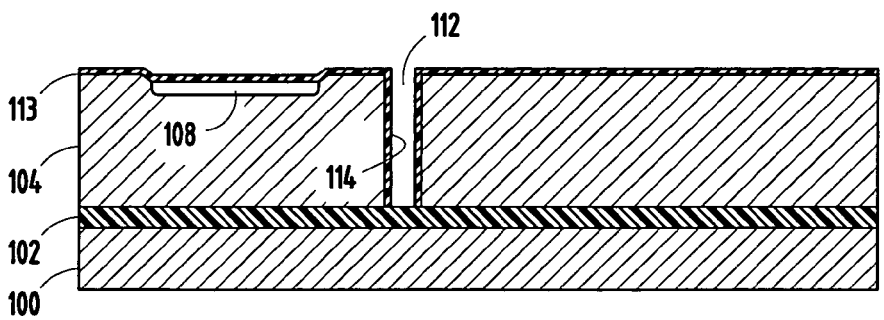
FIG. 11 is a cross-sectional view of the device illustrating another step of the method.
Figure 12:
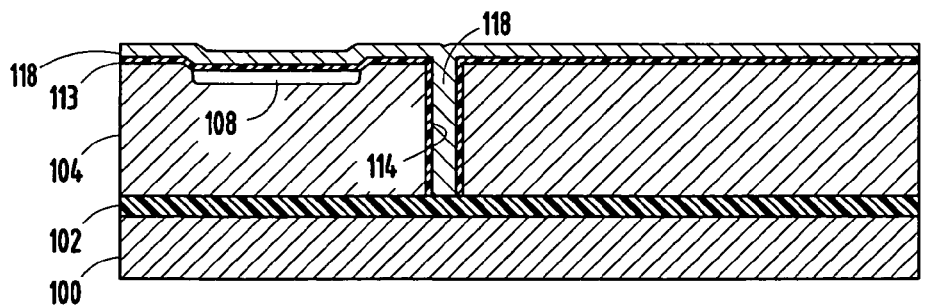
FIG. 12 is a cross-sectional view of the device illustrating another step of the method.
Figure 13:
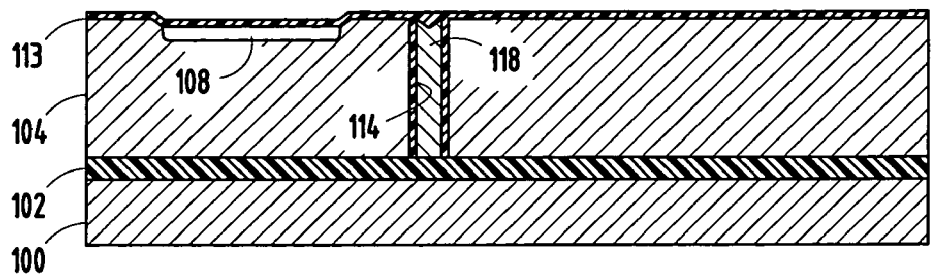
FIG. 13 is a cross-sectional view of the device illustrating another step of the method.

In the steps of FIG. 10, another oxide film 113 is then formed on the top surface of the silicon device layer 104. The oxide film 113 is masked and etched, and then the same mask is used to etch one or more high aspect ratio trenches 112 through the silicon device layer 104 to the buried oxide layer 102 of the silicon substrate 100 as shown in FIG. 10. The trenches 112 in the silicon device layer are lined with a dielectric layer 114, such as an oxide, as shown in FIG. 11, and the trenches 112 are thereafter filled completely with a conformal material 118, such as polysilicon or nitride, as shown in FIG. 12. The conformal material 118 is removed from the top surface of the structure, leaving the high aspect ratio trenches 112 filled with the conformal material 118 as shown in FIG. 13. This substantially planarizes the top surface of the silicon device layer 104, and completes the formation of the anti-stiction bumps 40 shown in FIG. 5. The oxide 113 on the top surface of the silicon device layer 104 is then removed, leaving the liner oxide 114 and the conformal material 118 in the planarized trenches 112. The trenches 112 provide electrical isolation between different portions of the epitaxial device layer 104.

Figure 14:
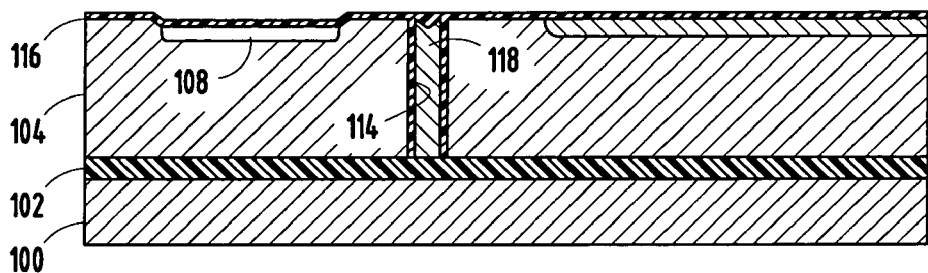
FIG. 14 is a cross-sectional view of the device illustrating another step of the method.
Figure 15:
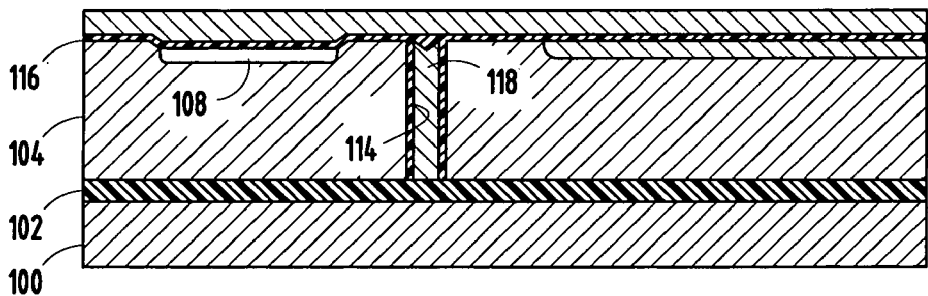
FIG. 15 is a cross-sectional view of the device illustrating another step of the method.

Yet another oxide film 116 is formed upon the top surface of the device, including upon the planarized top surfaces of the one or more trenches 112 as shown in FIG. 14. A mask is patterned on the surface, and a p-type dopant 120, such as boron, is implanted into the silicon 104 through the oxide 116 in the open windows areas of the mask. After the mask is stripped, an inorganic film 122, such as nitride, is then formed on the surface as shown in FIG. 15.

Figure 16:
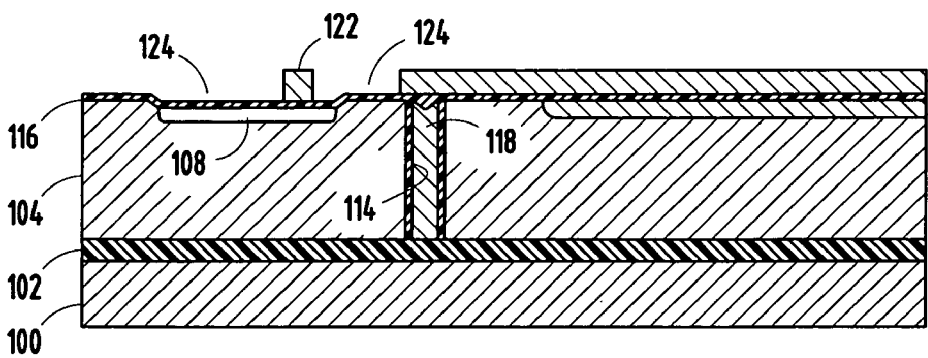
FIG. 16 is a cross-sectional view of the device illustrating another step of the method.

Referring next to FIG. 16, a mask is patterned and the inorganic film 122 is etched in the windows 124 to expose the oxide 116 in selected areas. The mask is then stripped.

In another step, a mask may be patterned and a p-type dopant, such as boron (not shown), may be implanted into the substrate through the oxide in the open windows in the mask. This p-type dopant may serve as a field implant to adjust resistivity of the surface where circuitry is to be formed. The mask is then stripped.

A mask may then be patterned and a p-type dopant, such as BF2 or argon (not shown), may be implanted into the substrate through the open windows in the mask. This additional p-type dopant may serve as a getter for collecting impurities, particularly away from electronics. The mask is then stripped.

Figure 17:
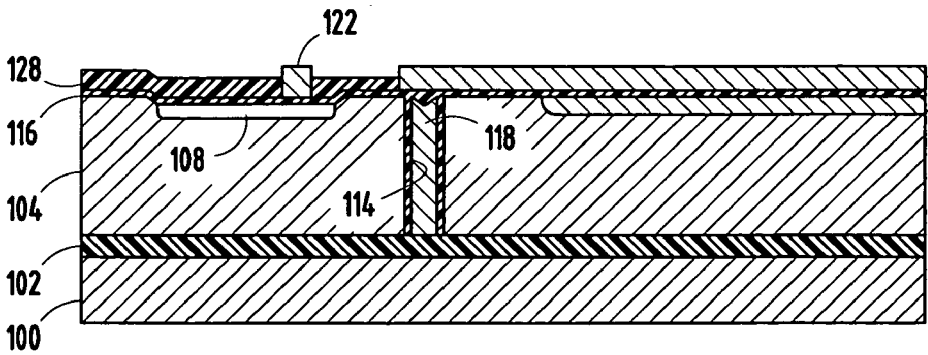
FIG. 17 is a cross-sectional view of the device illustrating another step of the method.
Figure 18:
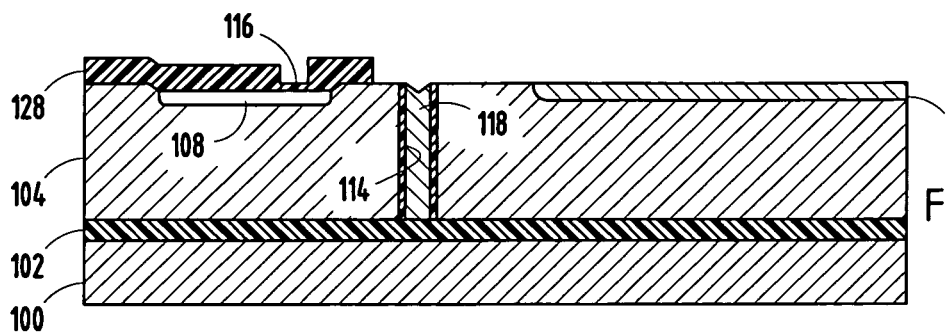
FIG. 18 is a cross-sectional view of the device illustrating another step of the method.

Referring to FIG. 17, an additional thickness of oxide 128 is then selectively formed in those areas of the substrate not covered by the inorganic film 122. An etch is done to remove any oxide 128 that was formed upon the inorganic film layer 122, but leaves the most recently formed additional thickness of oxide largely intact. The inorganic film 122 is then removed from the surface in the step shown in FIG. 18. This leaves the surface covered with two thicknesses of oxide 128 and 116, each thickness in different areas of the substrate surface. An oxide etch is then performed to remove the thinner of the two oxide films 116, exposing the silicon in those areas, and leaving most of the thicker oxide intact. The steps shown in FIGS. 17, 18 and 19 may be implemented using processes collectively known as a LOCOS process.

Figure 19:
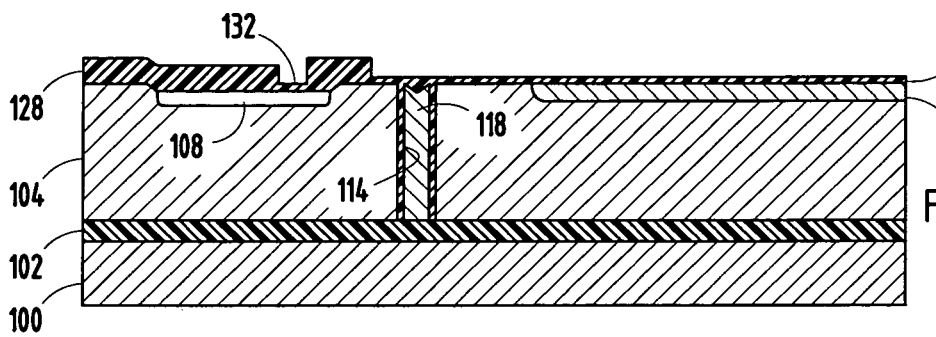
FIG. 19 is a cross-sectional view of the device illustrating another step of the method.

Referring to FIG. 19, an oxide film 132 is then formed upon the exposed silicon regions of the substrate. Little additional oxide forms on the areas of the substrate covered by the thicker oxide film 128. A p-type dopant, such as boron (not shown), is then implanted through the thinner oxide film 132 into the silicon 104. This p-type dopant adjusts the surface dopant concentrations in select regions. The thicker oxide layer 128 blocks the dopant from entering the silicon in those regions. The thin oxide film 132 is then etched away to expose the silicon in those regions.

Figure 20:
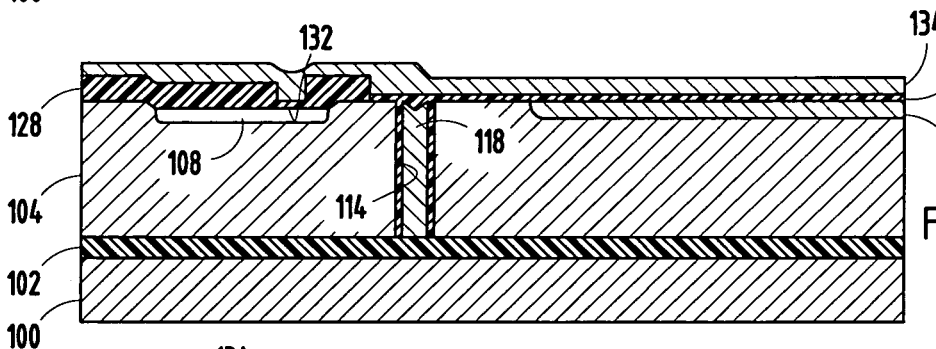
FIG. 20 is a cross-sectional view of the device illustrating another step of the method.

In FIG. 20, an oxide film 133 is then formed upon the exposed silicon regions of the substrate. Then a layer of polysilicon 134 is deposited upon the surface. An n-type dopant, such as phosphorus (not shown), is then introduced into the polysilicon and is thermally activated. This n-type dopant dopes the polysilicon 134 to create enhanced conductivity of the polysilicon.

Figure 21:
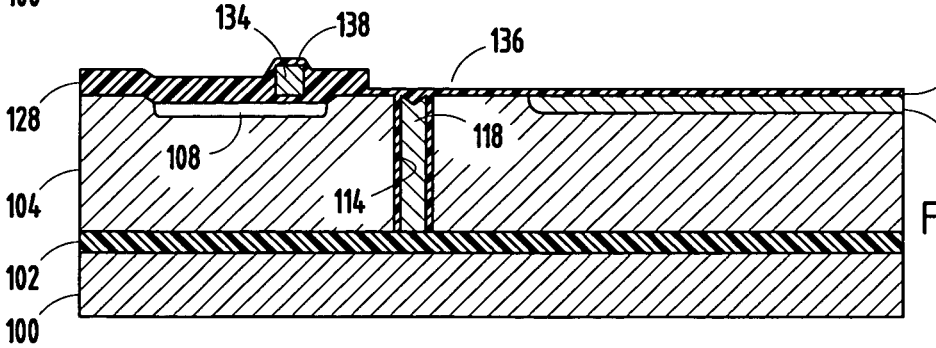
FIG. 21 is a cross-sectional view of the device illustrating another step of the method.
Figure 22:
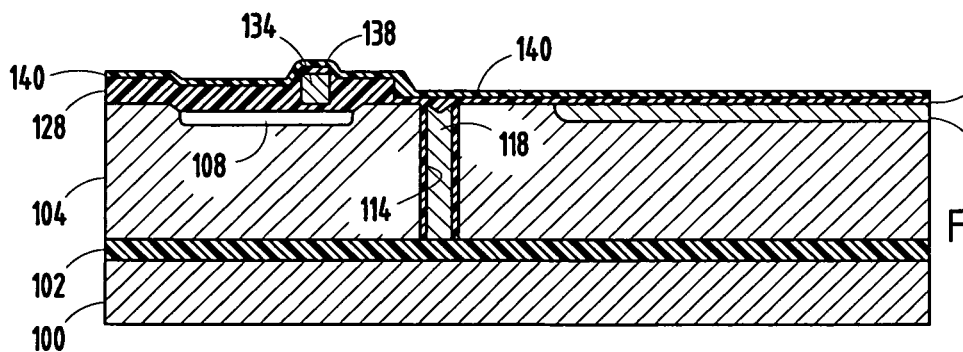
FIG. 22 is a cross-sectional view of the device illustrating another step of the method.
Figure 23:
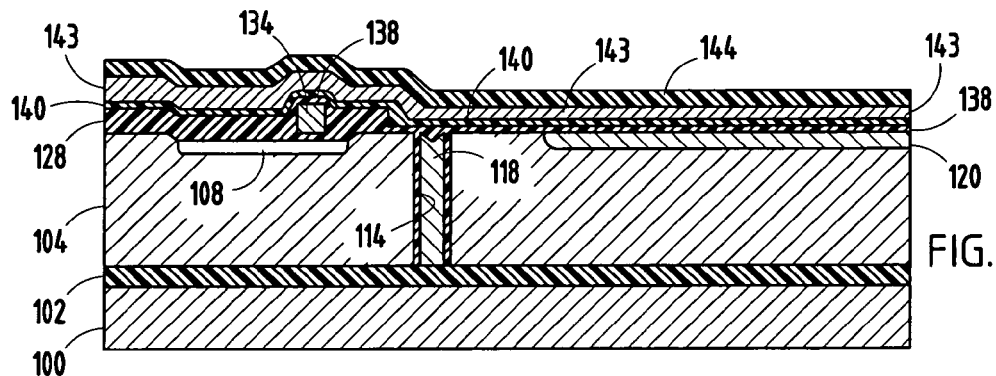
FIG. 23 is a cross-sectional view of the device illustrating another step of the method.

A mask is patterned and portions of the polysilicon film 134 are etched to expose the oxide in selected areas as shown in FIG. 21. The mask is then stripped. Exposed portions of oxide film 133 are then removed. An oxide film 138 is then formed upon the surface, including on the polysilicon. Little additional oxide forms on the areas of the substrate covered by the thicker oxide film 128. An inorganic film 140, such as nitride, is then formed on the surface as shown in FIG. 22. Then a layer of polysilicon 143 is deposited upon the surface as shown in FIG. 23. An n-type dopant, such as phosphorus (not shown), is then introduced into the polysilicon. The n-type dopant creates an n-type polysilicon with enhanced conductivity. A dielectric blocking film 144, such as undoped silicon glass (USG) or boron phosphorus silicon glass (BPSG), is then deposited on the polysilicon, and is densified/annealed.

Figure 24:
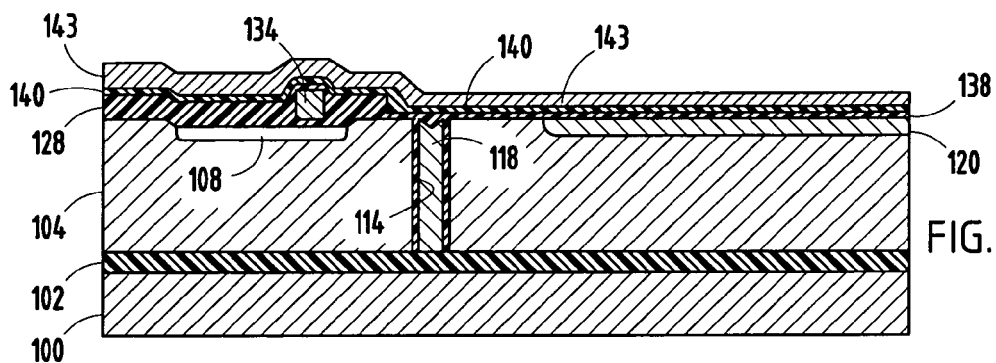
FIG. 24 is a cross-sectional view of the device illustrating another step of the method.

A mask is patterned and a portion of the blocking film 144 is etched through the open windows in the mask to expose portions of the polysilicon layer. An n-type dopant, such as phosphorus (not shown), is then introduced into the exposed areas of polysilicon, and is activated. This creates a polysilicon resistor circuit component. The blocking film 144 is then removed as shown in FIG. 24.

Figure 25:
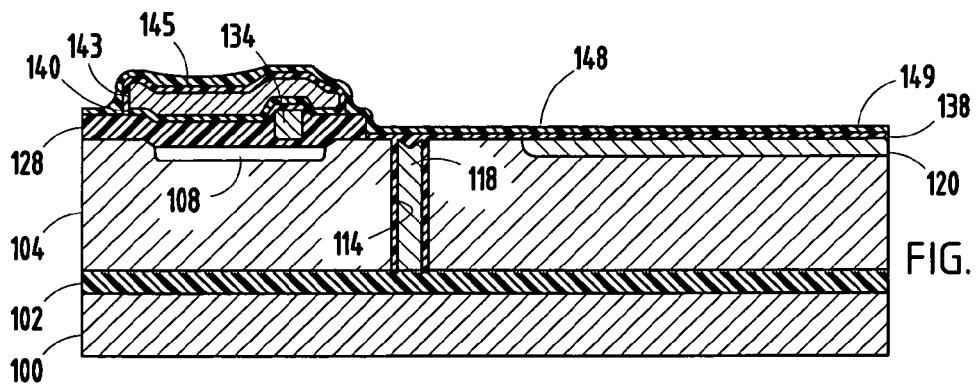
FIG. 25 is a cross-sectional view of the device illustrating another step of the method.

Referring to FIG. 25, a mask is patterned and portions of the polysilicon film 143 and nitride film 140 are etched to expose the oxide 128 and 138 in selected areas. The mask is then stripped. An oxide film 145 is then formed upon the surface of the polysilicon 143. Little additional oxide forms on the areas of the substrate covered by the thicker oxide film.

A mask is patterned and a p-type dopant, such as boron (not shown), is introduced into selected regions of the substrate. The mask is then stripped. The boron p-type dopant creates a circuit element, such as a resistor according to one example.

A mask is then patterned and a first n-type dopant, such as arsenic (not shown), is introduced into selected regions of the substrate. A second n-type dopant, such as phosphorus (not shown), is introduced into the same selected regions of the substrate. The mask is then stripped, and the dopants are thermally activated. This step forms one of the source or drain areas of a transistor device (e.g., CMOS).

Figure 26:
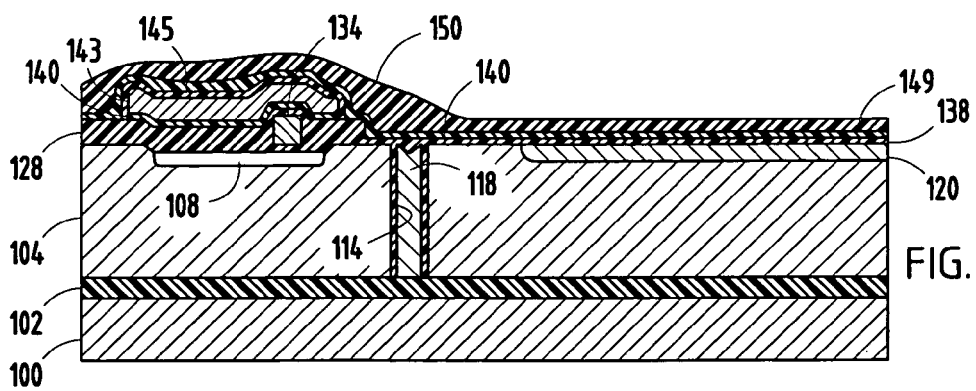
FIG. 26 is a cross-sectional view of the device illustrating another step of the method.

A mask is patterned and a p-type dopant, such as BF2 (not shown), is introduced into selected regions of the substrate. The mask is then stripped. The p-type dopant forms the other of the source or drain of the transistor device. An inorganic film 149, such as a deposited oxide, is then formed upon the surface as shown in FIG. 25. The dopant is then thermally activated. An inorganic film 150, such as a spin-on glass and/or an oxide film, is formed upon the surface of oxide 149 as shown in FIG. 26. A thermal treatment is then performed.

Figure 27:
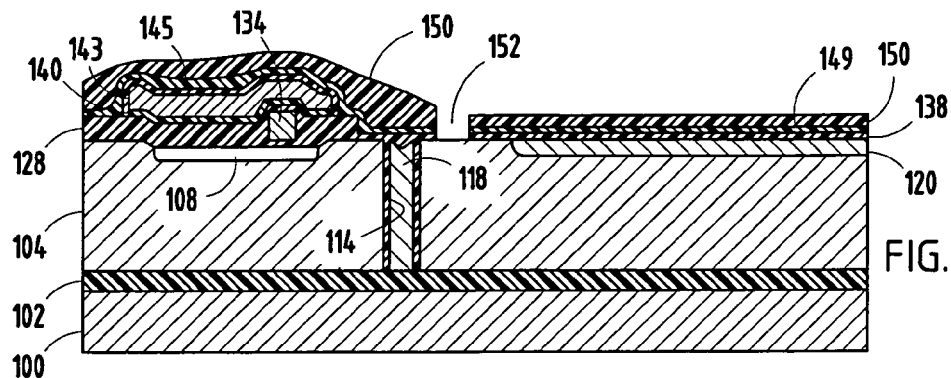
FIG. 27 is a cross-sectional view of the device illustrating another step of the method.

Referring to FIG. 27, a mask is patterned, and the inorganic film 149 and oxide film 138 and inorganic film 150 are etched in selected regions 152 to expose the silicon 104. This forms contact regions 152. The same patterned etching can be used to form contact regions on the polysilicon regions 143 and 134 to create electrical circuit pathways.

Figure 28:
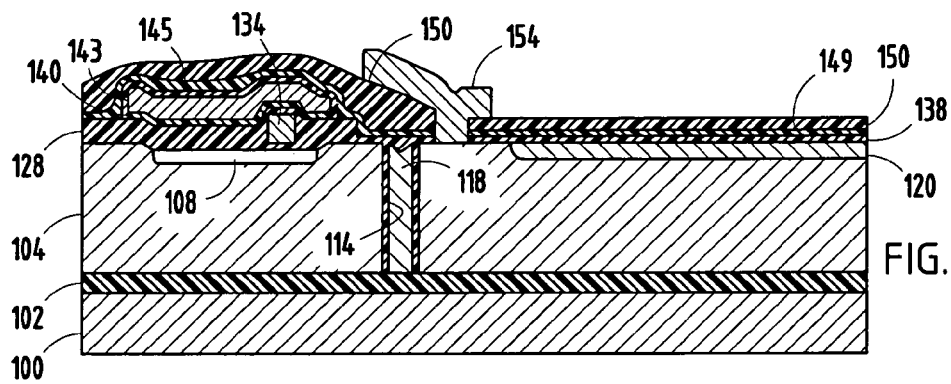
FIG. 28 is a cross-sectional view of the device illustrating another step of the method.
Figure 29:
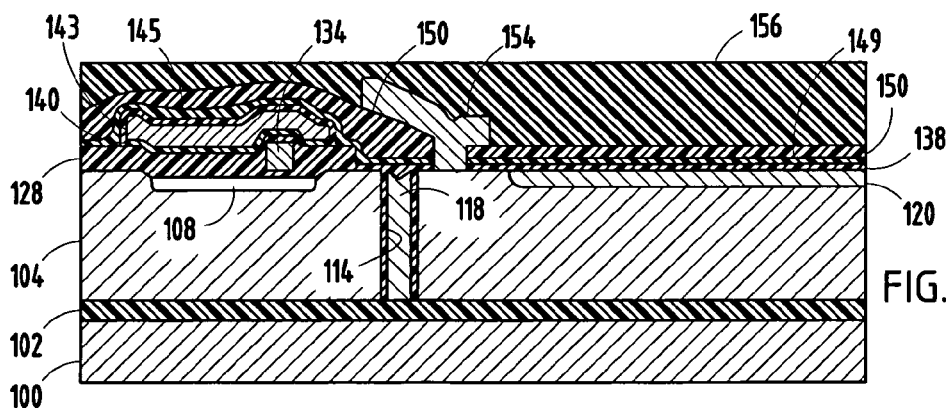
FIG. 29 is a cross-sectional view of the device illustrating another step of the method.

Referring to FIG. 28, a first metal film 154 is then formed on the substrate and within region 152 to make conductive contact with silicon 104. A mask is then patterned and selected areas of the first metal film 154 are etched to achieve the desired conductivity path as shown in FIG. 28.

A first inorganic film, such as a deposited oxide, is then formed on the surface. A second inorganic film, such as a spin-on glass, is then formed on the surface. The surface is then etched to form a largely planar surface, and then a third inorganic film, such as a deposited oxide, is formed on the surface. The three aforementioned inorganic films are identified together as composite oxide layer 156 in FIG. 29 and serve to provide a planar dielectric surface between conductive elements. According to other embodiments, a chemical mechanical planarization (CMP) process may be employed to planarize the wafer surface after all metal and inter-level metal dielectric film sequences.

Figure 30:
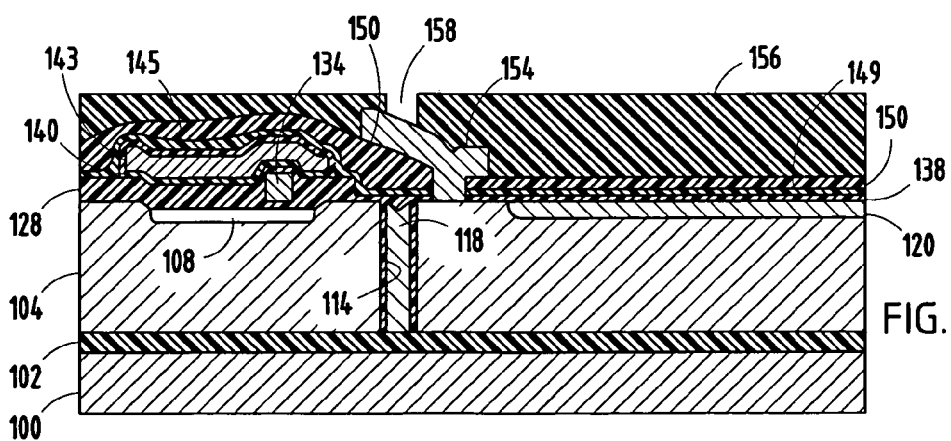
FIG. 30 is a cross-sectional view of the device illustrating another step of the method.

A mask is then patterned and portions of the composite oxide 156 covering the first metal 154 are etched to form one or more via openings 158 as shown in FIG. 30.

Figure 31:
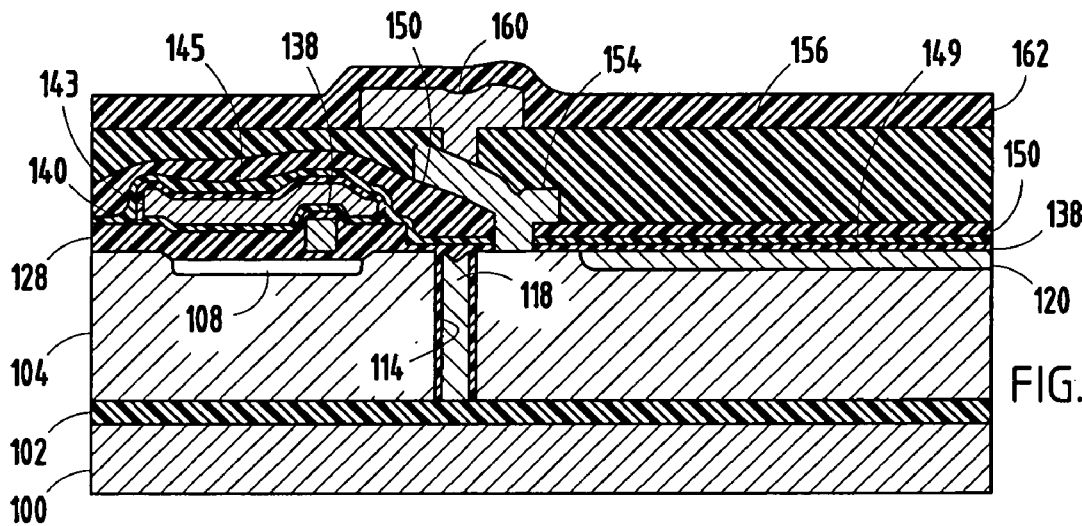
FIG. 31 is a cross-sectional view of the device illustrating another step of the method.

Referring to FIG. 31, a second metal film 160 is then formed on the surface and in contact with the first metal 154 to fill in the via openings. A mask is patterned and selected areas of the second metal 160 are etched. The mask is stripped, and an inorganic film 162, such as an oxynitride, is formed on the surface.

A mask is then applied to the device side (front) surface of the substrate, and the various films, including inorganics like oxide, nitride, oxynitride, and polysilicon, are removed from the back surface of the substrate, resulting in a bare silicon back surface. The mask is then stripped.

Figure 32:
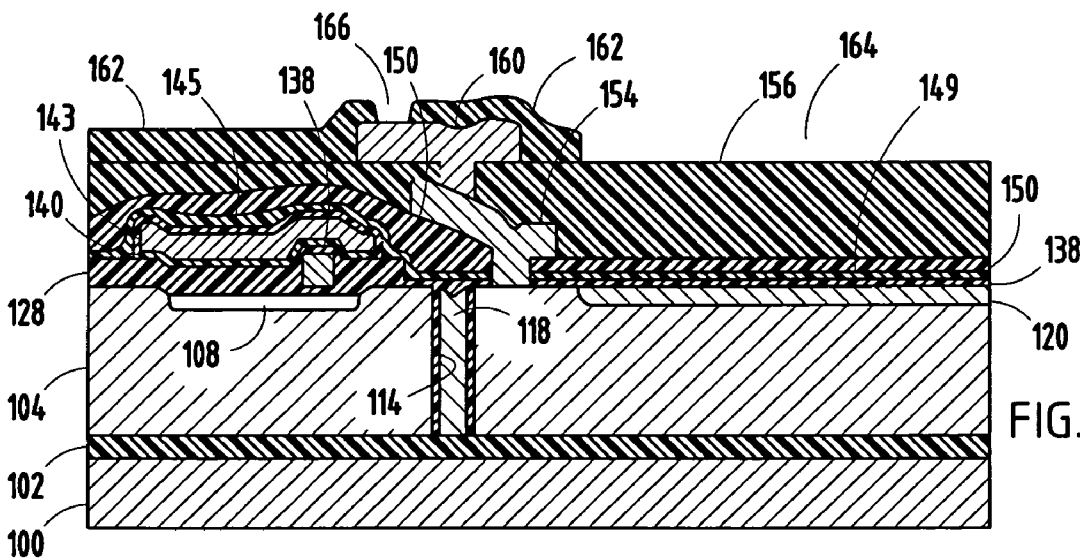
FIG. 32 is a cross-sectional view of the device illustrating another step of the method.

Referring to FIG. 32, a mask is then patterned and portions 166 of the inorganic film 162 covering the second metal 160 are etched to form exposed contact pads. The mask is then stripped. A thermal treatment is then applied to anneal the metal.

Figure 33:
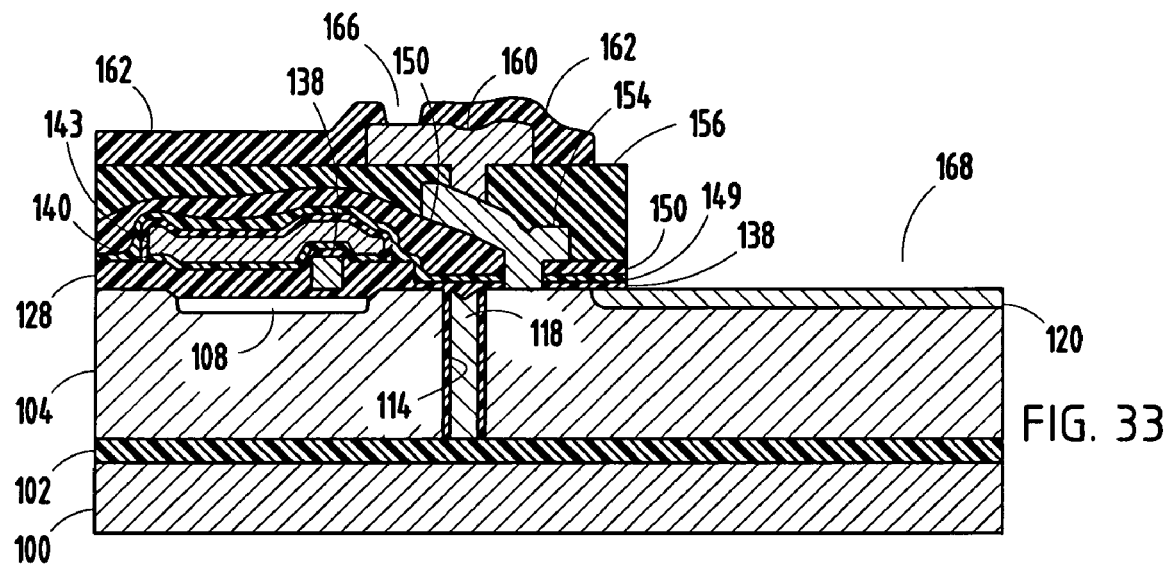
FIG. 33 is a cross-sectional view of the device illustrating another step of the method.
Figure 34:
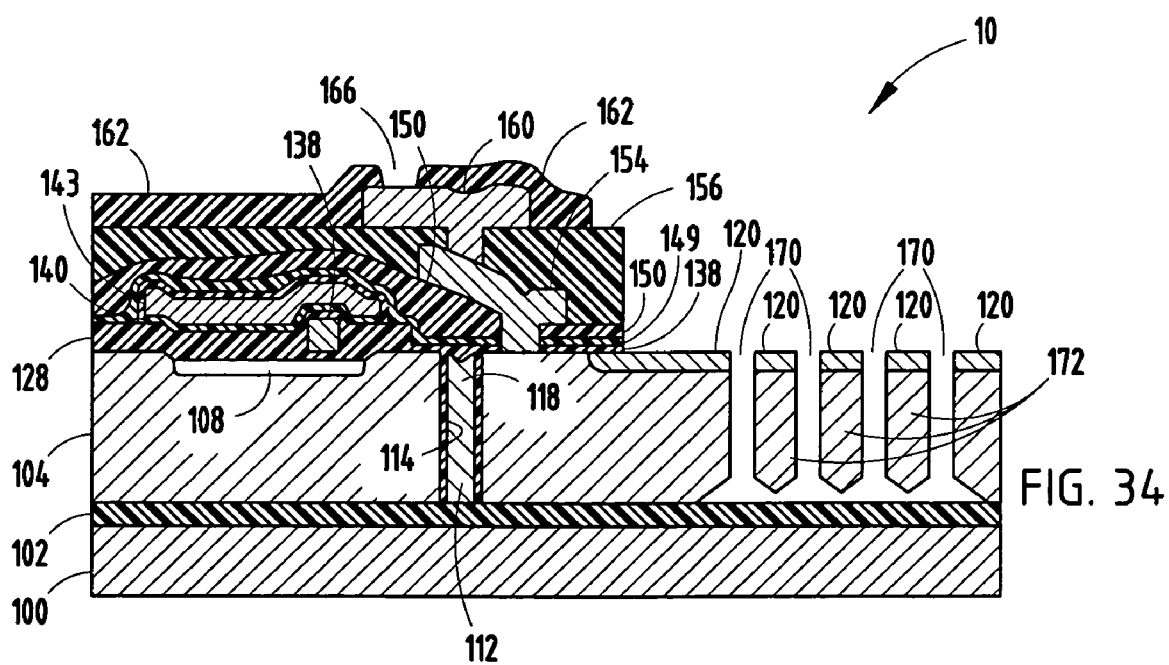
FIG. 34 is a cross-sectional view of the sensor device according to a further step of the method.

Referring to FIG. 33, a mask is patterned and portions of the inorganic layers 138, 149, 150 and 156 covering the silicon are then etched to expose the silicon in the regions where the sensing elements are formed. The etch may comprise isotropic or anisotropic etch methods. The mask is then stripped.

A mask is then patterned and portions of the silicon are anisotropically etched, such as by a DRIE etch tool, to delineate and release the sensor elements as shown in FIG. 34. This includes forming trenches 170 which provide physical and electrical isolation and/or releases sensor element(s) 172. Both vertical and lateral etching may be employed. The mask is then stripped, which completes the device fabrication.

A previously made cap wafer (not shown) may be aligned to the device wafer, and the two wafers bonded together to provide a cap over the sensor element. The cap provides for a hermetic seal of the sensor element, thus protecting it from physical damage due to handling, particulate contamination, and moisture, etc. The bond may entail using a glass frit. The frit may be used over the on-board circuitry of the integrated sensor without affecting the functionality of the circuit.

Finally, in steps after the integrated sensor is completed and capped, the bond pads are exposed, the device is tested, and the die are singulated.

Micromachined sensor elements formed by this process may be fabricated in the plane of the substrate. This makes them significantly less prone to damage than conventional approaches which have sensor components formed above the plane of the substrate.

The process is versatile in that sensors may be made with the process that sense different physical quantities, such as angular rate, angular acceleration, and linear acceleration in one or more than one direction. These devices may be formed simultaneously on the same substrate in any advantageous combination. The process is simple, and does not require buried cavities, thus preventing the process complexities, process difficulties, and yield losses associated with such processes.

The sensor element release process is simple, and may be done in the same equipment as the sensor delineation process. It does not require additional expensive capital equipment or difficult processes at the release step. No liquid or vapor undercuts are required and thus, no stiction results from wet undercut processes. In one embodiment, the sensor element is delineated using a DRIE trench etch, and then is released using a DRIE lateral etch. The lateral etch may be done as a footer etch in a DRIE machine.

The getter implant module getters defects in the device layer according to one embodiment, thus increasing the CMOS yield. According to other embodiments, the process may not include a getter implant module. According to a further embodiment, the bottom of the epi device layer 104 may be implanted with an appropriate getter implant prior to bonding the device layer 104 onto the insulating layer 102 on the substrate 100.

The isolation process module provides anti-stiction bumps for lateral stiction prevention for moving structures such as rings and fingers. Other isolation and anti-stiction bumps may be formed during the sensor element delineation and release process. A method of forming isolation and anti-stiction bumps according to an isolation process according to another embodiment is further illustrated in FIGS. 35-42.

Figure 35:
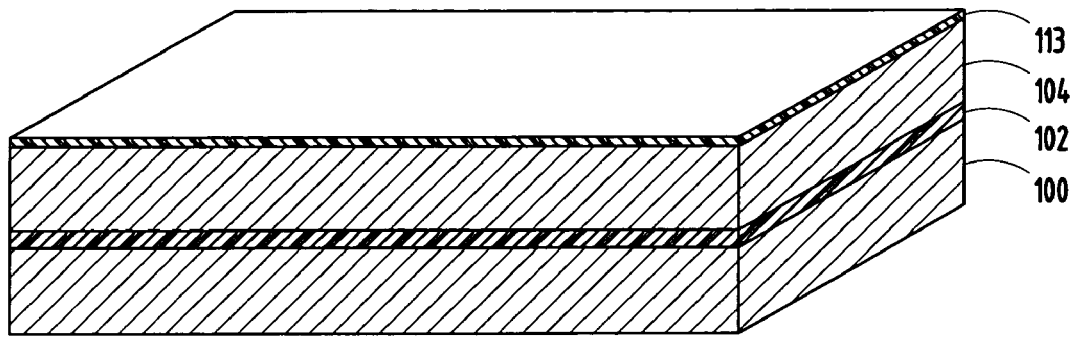
FIG. 35 is a perspective cross-sectional view of a sensor device showing an initial step of forming anti-stiction bumps according to one embodiment of an isolation formation process.
Figure 36:
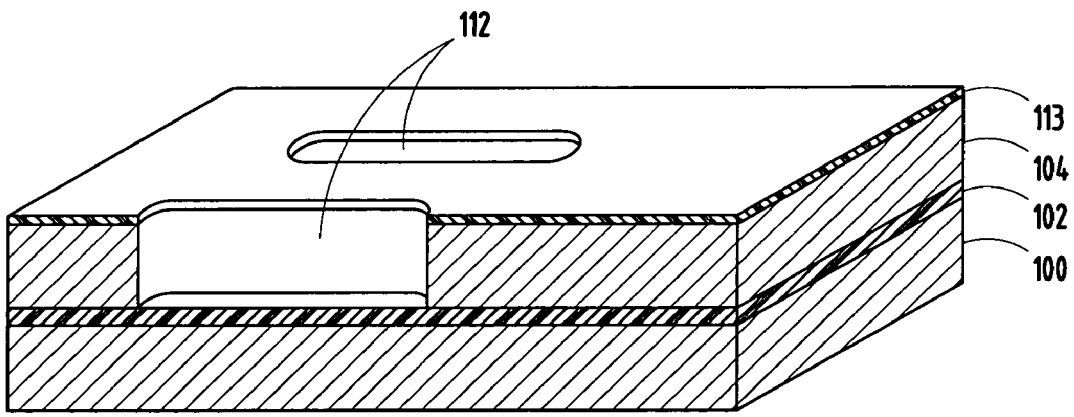
FIG. 36 is a perspective cross-sectional view of the sensor device of FIG. 35 illustrating another step in the method of forming anti-stiction bumps.

Referring to FIG. 35, a method of forming anti-stiction bumps generally includes providing a starting material having a silicon substrate 100 on the bottom with an oxide insulation layer 102 provided on top, and an epitaxial device layer 104 of silicon formed upon the layer of oxide 102. Additionally, an oxide film 113 is formed on top of the silicon device layer 104. Next, in the step illustrated in FIG. 36, trenches 112 are formed in a desired shape extending through silicon device layer 104 and oxide layer 113. The trenches 112 are formed extending down to the top surface of the oxide insulation layer 102.

Figure 37:
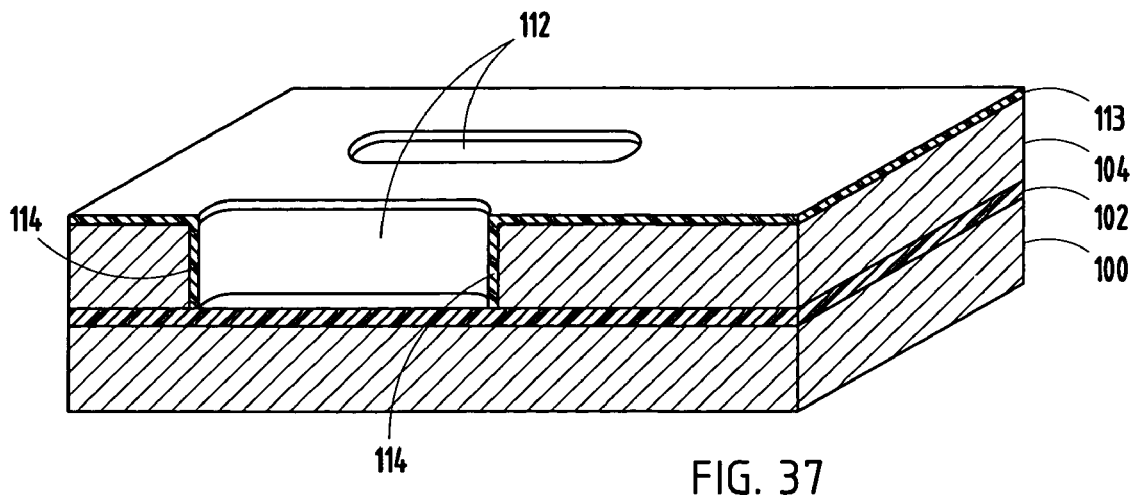
FIG. 37 is a perspective cross-sectional view of the sensor device of FIG. 36 further illustrating another step in the method of forming anti-stiction bumps.

The side walls of trenches 112 in the silicon device layer are lined with a dielectric layer 114, such as an oxide, as shown in FIG. 37.

Figure 38:
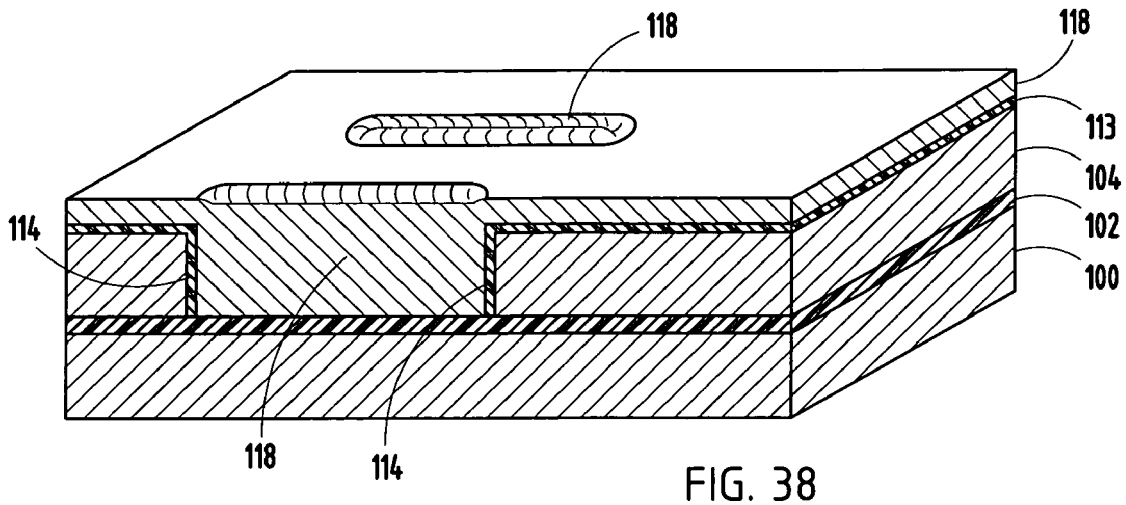
FIG. 38 is a perspective cross-sectional view of the sensor device of FIG. 37 further illustrating another step in the method of forming anti-stiction bumps.
Figure 39:
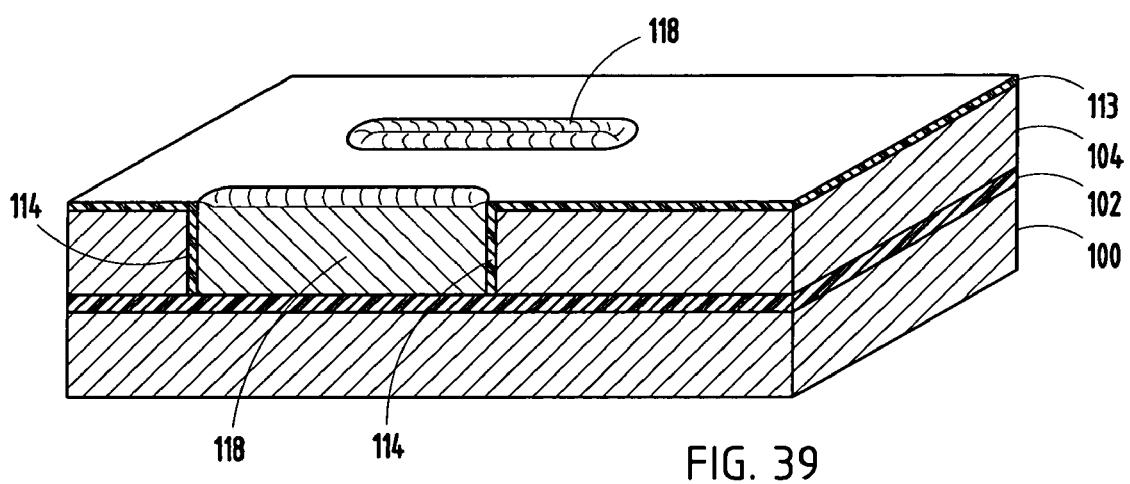
FIG. 39 is a perspective cross-sectional view of the sensor device of FIG. 38 further illustrating another step in the method of forming anti-stiction bumps.
Figure 40:
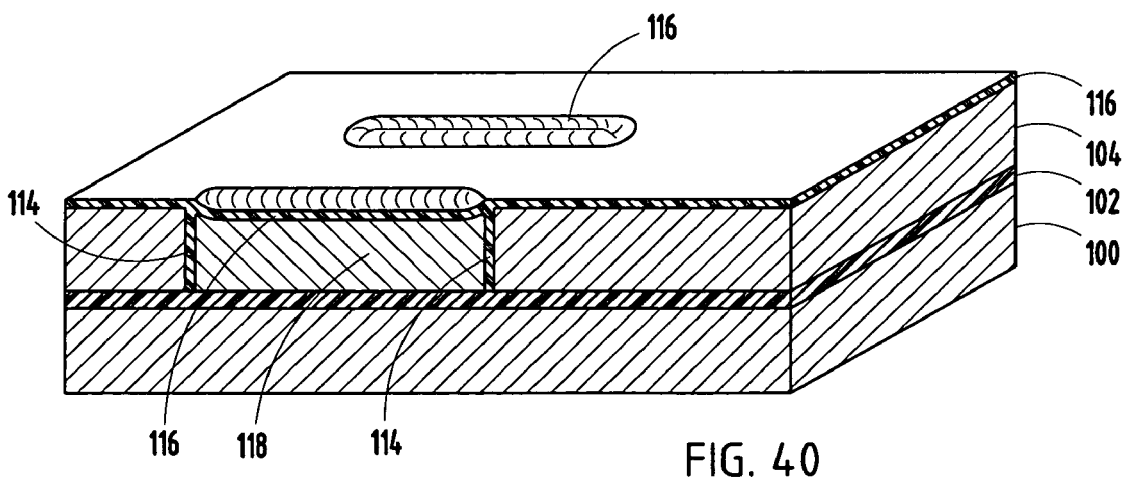
FIG. 40 is a perspective cross-sectional view of the sensor device of FIG. 39 further illustrating another step in the method of forming anti-stiction bumps.

Referring to FIG. 38, the next step in the process of forming the anti-stiction bumps includes filling the trenches 112 with a conformal material 118, such as polysilicon or nitride. The conformal material 118 on top of oxide layer 113 is then removed, leaving conformal material 118 in the trenches 112 as shown in FIG. 39. The oxide 113 on the top surface of the silicon device layer 104 is then removed, leaving the liner oxide 114 and the conformal material 118 in the planarized trenches 112. The trenches 112 provide electrical isolation between different portions of the epitaxial device layer 104. An oxide film 116 is then formed upon the top surface of the device, including upon the planarized top surfaces of the one or more trenches 112 as seen in FIG. 40.

Figure 41:
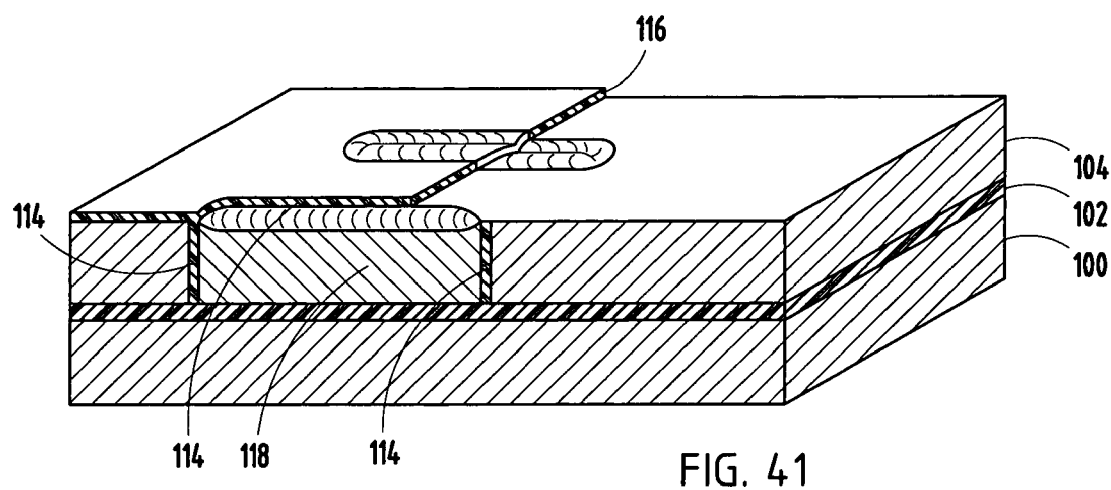
FIG. 41 is a perspective cross-sectional view of the sensor device of FIG. 40 further illustrating another step in the method of forming anti-stiction bumps.
Figure 42:
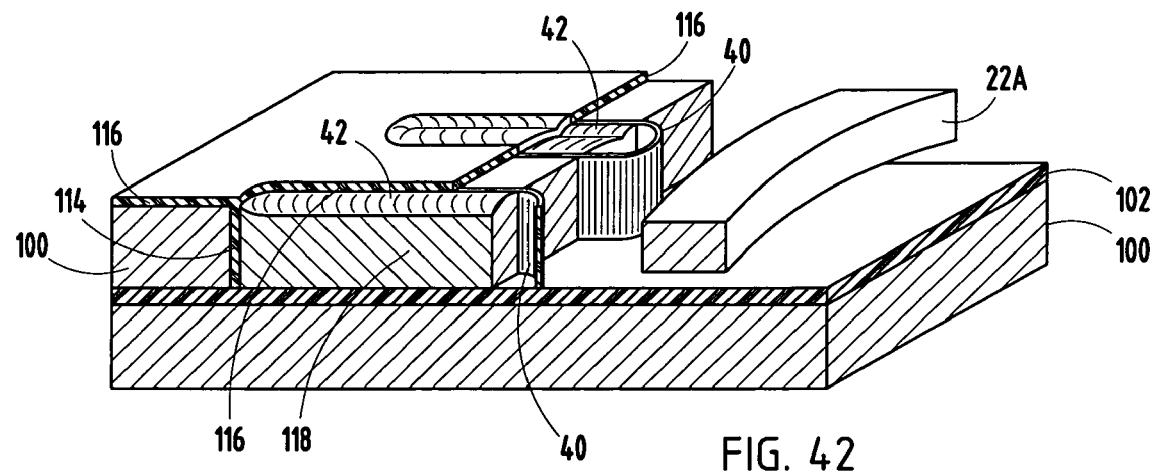
FIG. 42 is a perspective cross-sectional view of the sensor device of FIG. 41 further illustrating a further step in the method of forming anti-stiction bumps.

Referring to FIG. 41, the sensor device is shown following the step of removing the oxide film 116 about a portion of the sensor device so as to expose part of the trenches. Next, in FIG. 42 the epitaxial device layer is etched away so as to form a suspended member 22A and to provide for the trench having conformal isolation and anti-stiction members extending therefrom, labeled 40. The extending member 40 extending from trench 112 forms one or more isolation and anti-stiction bumps. The anti-stiction bumps 40 provide for lateral stiction prevent for moving structures, such as structure 22A.

Sensors made from the process have no need for temperature compensation since all the mechanical components of the sensor element, including the drive, sense, and balance electrodes, the ring, springs, etc., are made of single crystal silicon. Thus, no differences exist in thermal expansion rates of the sensor element members.

The electrical isolation of portions of the device silicon layer may be moved to the end of the process. The frit bonding may occur over the on-board electronics of the integrated sensor device without adversely affecting the functionality of the circuitry.

It will be understood by those who practice the invention and those skilled in the art, that various modifications and improvements may be made to the invention without departing from the spirit of the disclosed concept. The scope of protection afforded is to be determined by the claims and by the breadth of interpretation allowed by law.

The invention claimed is:

1. A method for manufacturing a sensor device having a circuit portion and a movable sensing portion, the method comprising the steps of:

providing a substrate having an insulation layer on a top surface;

providing a silicon layer on top of the insulation layer;

forming a first trench extending through the silicon layer and reaching the insulation layer so as to isolate a first portion of the silicon layer from a second portion of the silicon layer;

disposing a fill material within the first trench;

forming one or more electrical components on the first portion of the silicon layer;

forming one or more contacts on the second portion of the silicon layer;

forming one or more second trenches in the second portion of the silicon layer so as to provide one or more movable elements within the second portion of the silicon layer, wherein the one or more movable elements serve as sensing elements; and forming one or more anti-stiction bumps to prevent a portion of movable element from sticking to an adjacent feature of the sensor;

wherein the step of forming the second trench exposes at least a portion of the anti-stiction bumps.

2. The method as defined in claim 1, wherein the step of forming the one or more anti-stiction bumps comprises forming the anti-stiction bumps prior to delineation and release of the movable element.

3. The method as defined in claim 1 further comprising the step of forming a dielectric layer on sides of the first trench prior to disposing the fill material within the first trench.

4. The method as defined in claim 1, wherein the sensor device comprises an angular rate sensor.

5. The method as defined in claim 1, wherein the substrate comprises silicon.

6. The method as defined in claim 1, wherein the silicon layer comprises an epitaxial layer.

7. The method as defined in claim 3 further comprising the step of forming an oxide film upon the top surface of the fill material.

8. A method for manufacturing a sensor device having a circuit portion and a movable sensor portion, the method comprising the steps of:

providing a substrate having an insulation layer on a top surface;

providing a silicon layer on top of the insulation layer;

forming a first trench extending through the silicon layer and reaching the insulation layer so as to isolate a first portion of the silicon layer from a second portion of the silicon layer;

forming a dielectric layer on side walls of the first trench;

disposing a first fill material within the first trench;

forming one or more electrical components on the first portion of the silicon layer;

forming one or more contacts on the second portion of the silicon layer;

forming one or more second trenches in the second portion of the silicon layer so as to provide one or more movable elements within the second portion of the silicon layer, wherein the step of forming the one or more second trenches includes delineation and release of the one or more movable elements, and wherein the one or more movable elements serve as sensing elements; and forming one or more anti-stiction bumps to prevent a portion of a movable element from sticking to an adjacent feature of the sensor, wherein the step of forming one or more anti-stiction bumps comprises forming the anti-stiction bumps prior to the delineation and release of the movable element;

wherein the step of forming the second trench exposes at least a portion of the anti-stiction bumps.

9. The method as defined in claim 8 further comprising the step of forming an oxide film upon the top surface of the fill material.

10. The method as defined in claim 8, wherein the sensor comprises an angular rate sensor.

11. The method as defined in claim 8, wherein the substrate comprises silicon.

12. The method as defined in claim 8, wherein the silicon layer comprises an epitaxial layer.

* * * * *